(12) United States Patent
Wu et al.

(10) Patent No.: US 7,499,050 B2
(45) Date of Patent: Mar. 3, 2009

(54) METHOD AND SYSTEM FOR MESH-FREE ANALYSIS OF GENERAL THREE-DIMENSIONAL SHELL STRUCTURES

(75) Inventors: Cheng-Tang Wu, Livermore, CA (US); Yong Guo, San Ramon, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 484 days.

(21) Appl. No.: 10/990,003

(22) Filed: Nov. 16, 2004

(65) Prior Publication Data

US 2006/0103648 A1    May 18, 2006

(51) Int. Cl.
*G06T 17/00* (2006.01)
*G06F 7/60* (2006.01)
*G06F 17/10* (2006.01)

(52) U.S. Cl. .......................................... 345/420; 703/2
(58) Field of Classification Search ................. 345/420, 345/424; 703/2
See application file for complete search history.

(56) References Cited

U.S. PATENT DOCUMENTS

| 5,604,891 | A | * | 2/1997 | Burnett et al. .................. 703/2 |
| 5,963,459 | A | * | 10/1999 | Burnett et al. .................. 703/5 |
| 6,718,291 | B1 | | 4/2004 | Shapiro |
| 6,876,956 | B1 | * | 4/2005 | Cirak et al. ..................... 703/2 |

OTHER PUBLICATIONS

Meagher, "Efficient Synthetic Image Generation of Arbitrary 3-D Objects", 1982, IEEE, pp. 473-478.*

Muller et al., "Point Based Animation of Elastic, Plastic and Melting Objects", 2004, ACM Eurographics, pp. 141-151.*

P. Krysl, T. Belytschko, Analysis of thin shells by the element-free Galerkin method, Intl. Solids Structures Vo. 33, No. 20-22, pp. 3057-3080, 1996, Elsevier, UK.

J. Chen, C, Pan, C. Wu, W. Liu, Reproducing kernel particle methods for large deformation analysis of non-linear structures, Comp. Methods Appl. Mech. Engrg. 139, pp. 195-227, 1996, Elsevier.

F. Gunther, W. Liu, Implementation of boundary conditions for meshless methods, Comp. Methods Appl. Mech. Engrg. 163, pp. 205-230, 1998, Elsevier.

J. Meek, Y. Wang, Nonlinear static and dynamic analysis of shell structures with finite rotation, Comp. Methods Appl. Mech. Engrg. 162, pp. 301-315, 1998, Elsevier.

(Continued)

*Primary Examiner*—M Good Johnson
(74) *Attorney, Agent, or Firm*—Roger H. Chu

(57) ABSTRACT

A method, system and computer program product pertained to engineering analysis of a general three-dimensional (3-D) shell structure using the mesh-free technique is disclosed. The structural responses are solved with mesh-free technique after the 3-D shell structure is mapped to a two-dimensional plane. According to one aspect, the present invention is a method for mesh-free analysis of a general three-dimensional shell structure, the method comprises: defining the general shell structure as a physical domain represented by a plurality of nodes in a three-dimensional space, creating a plurality of projected nodes by mapping the plurality of nodes in the three-dimensional space onto a two-dimensional plane, assigning a plurality of domain of influences, one for each of the plurality of projected nodes, and calculating a solution of the physical domain using a set of mathematical approximations pertaining to each of the plurality of projected nodes.

44 Claims, 37 Drawing Sheets

OTHER PUBLICATIONS

H. Noguchi, T. Kawashima, T. Miyamura, Element free analyses of shell and spatial structures, Int. J. Numer. Meth. Engng. 47, pp. 1215-1240, 2000, John Wiley.

J. Chen, C. Wu, S. Yoon, Y. You, A stabilized conforming nodal integration for Galerkin mesh-free methods, Int. J. Numer. Meth. Engng. 50, pp. 435-466, 2001, John Wiley.

* cited by examiner

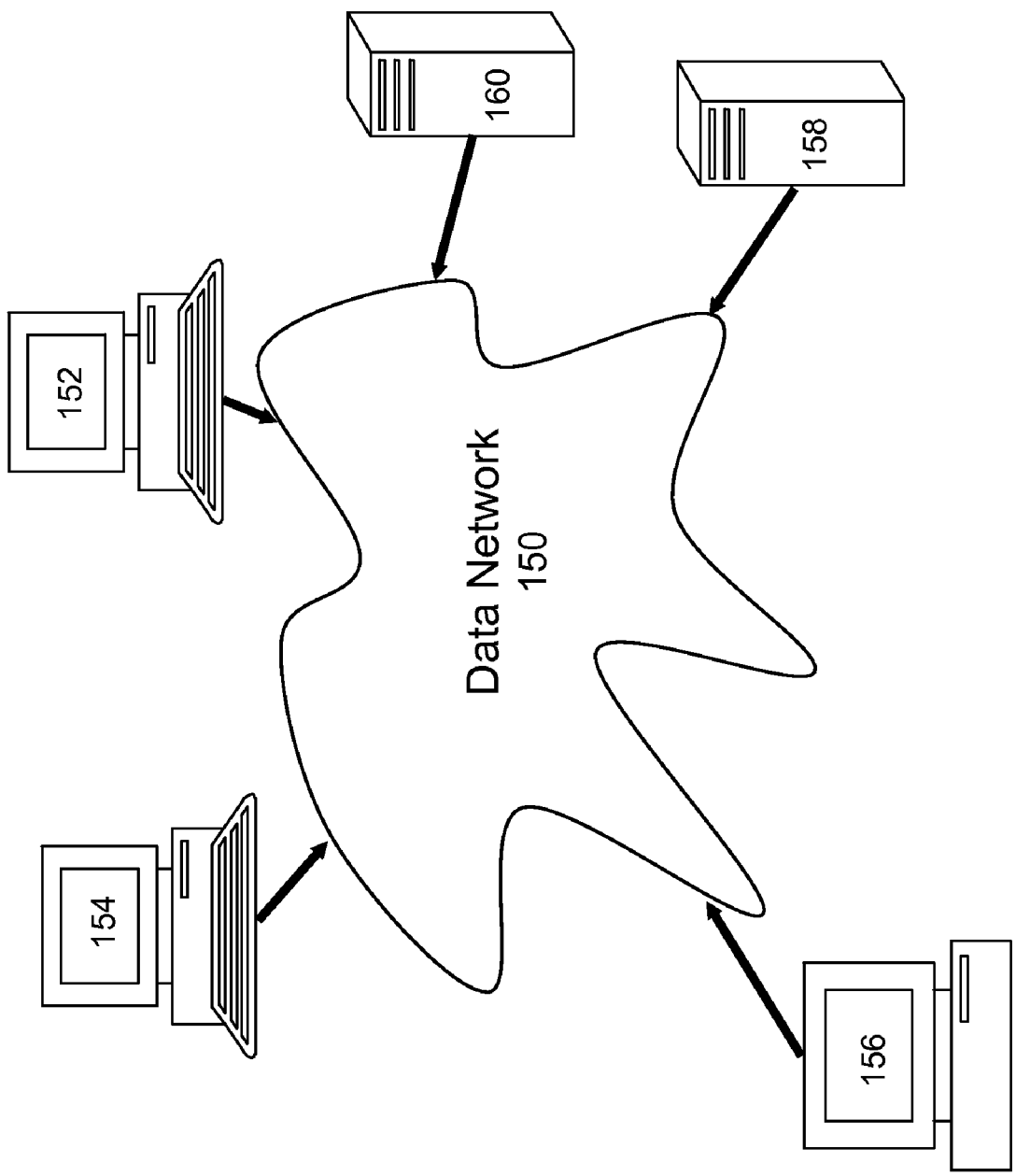

$$J(u^h(x)) = \int_\Omega [u^h(x,s) - u(s)]^2 w_a(x-s)ds$$

$$\text{where: } u^h(x,s) = \sum_{i=1}^{n} b_i^{[n]}(x)(x-s)^i$$

— 412

$$\frac{\partial J(x)}{\partial b_i^{[n]}(x)} = 0$$

$$= 2\int_\Omega [u^h(x,s) - u(s)] w_a(x-s)(x-s)^i \sum_{j=1}^{n}(x-s)^j\, db_j^{[n]}(x)ds$$

$$\text{for } i = 1,\ldots,n$$

$$\int_\Omega H^{[n]}(x-s)[H^{[n]T}(x-s)b^{[n]}(x)-u(s)]w_a(x-s)ds=0$$

$$b^{[n]}(x)=M^{[n]-1}(x)\int_\Omega H^{[n]}(x-s)u(s)w_a(x-s)ds$$

$$\text{where } M^{[n]}(x)=\int_\Omega H^{[n]}(x-s)H^{[n]T}(x-s)w_a(x-s)ds$$

422

$$u^h(x)=\int_\Omega u(s)\overline{w}_a^{[n]}(x-s)ds$$

$$\overline{w}_a^{[n]}(x-s)=H^{[n]T}(0)M^{[n]-1}(x)H^{[n]}(x-s)w_a(x-s)$$

$$u^h(x) = \sum_{I=1}^{NP} \overline{w}_a^{[n]}(x-x_I) u(x_I) \Delta x_I$$

$$\Psi_I(x) = \overline{w}_a^{[n]}(x-x_I) \Delta x_I \quad \text{shape function}$$

$$\Psi_I(x) = \boldsymbol{H}^{[n]T}(\boldsymbol{0}) \boldsymbol{M}^{[n]-1}(x) \boldsymbol{H}^{[n]}(x-x_I) w_a(x-x_I) \Delta x_I$$

$$\boldsymbol{H}^{[n]T}(x-x_I) = [1, x_1 - x_{1I}, x_2 - x_{2I}, x_3 - x_{3I}, \ldots, (x_{n_{sd}} - x_{n_{sd}I})^n]$$

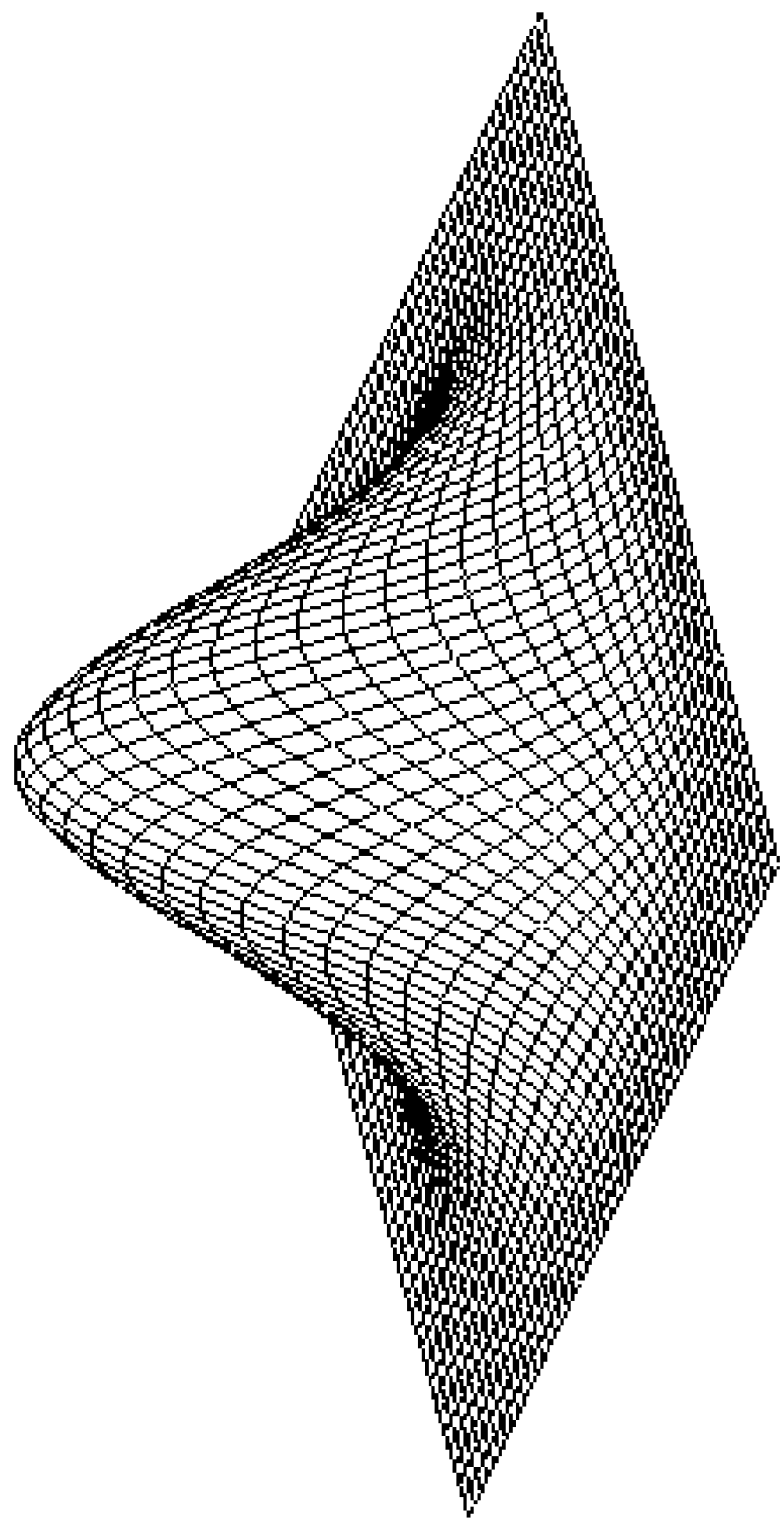

452

$$\int_\Omega w_a(x-s)ds = 1, \ x \in \Omega$$

$$\sum_I \Psi_I(x) = 1, \ x \in \Omega$$

458

$$u^h(x) = \sum_{I=1} \Psi_I(x) u(x_I)$$

$$\Psi_I(x) = \frac{w_a(x-x_I)}{\sum_{J=1} w_a(x-x_J)}$$

$$\sum_{I=1} \Psi_I(x) = \frac{\sum_{I=1} w_a(x-x_I)}{\sum_{J=1} w_a(x-x_J)} = 1, \ x \in \Omega$$

FIG. 4F $$u_i^h(x,t) = \sum_{I=1}^{NP} N_I(x) d_{iI}(t)$$

$$d_{iI}(t) \neq u_i^h(x_I,t)$$

$$\delta d_{iI}(t) \neq 0$$

$$\Rightarrow \delta u_i^h(x,t) \neq 0 \quad for \ x \in \Gamma^u \quad (Boundary \ Nodes)$$

*FIG. 5A*

$$u_i^h(x_I, t) = u_i^0(x_I, t) =: g_i(x_I, t); \quad I = 1, \ldots, N_b$$

$$denote \quad g_{iI}(t) = g_i(x_I, t); \quad I = 1, \ldots, N_b$$

$$u_i^h(x, t) = \sum_{I=1}^{NP} N_I(x) d_{iI}(t) = \sum_{I=1}^{N_b} N_I^b(x) d_{iI}^b(t) + \sum_{I=1}^{N_{nb}} N_I^{nb}(x) d_{iI}(t)$$

$$where: \quad N_{nb} = NP - N_b$$

$$u_i^h(x, t) = \mathbf{N^b}(x)\mathbf{d_i^b}(t) + \mathbf{N^{nb}}(x)\mathbf{d_i^{nb}}(t)$$

$$\mathbf{N^b}(x) := [N_1^b(x), \ldots, N_{N_b}^b(x)]; \mathbf{d_i^b}(t) := [d_{i1}^b(t), \ldots, d_{iN_b}^b(t)]^T$$

$$\mathbf{N^{nb}}(x) := [N_1^{nb}(x), \ldots, N_{N_{nb}}^{nb}(x)]; \mathbf{d_i^{nb}}(t) := [d_{i1}^{nb}(t), \ldots, d_{iN_{nb}}^{nb}(t)]^T$$

$$\text{Let } \mathbf{D}^b := \{N_I^b(x_J)\}^{N_b \times N_b} \text{ and } \mathbf{D}^{nb} := \{N_I^b(x_J)\}^{N_b \times N_{nb}}$$

$$d_i^b(t) = (\mathbf{D}^b)^{-1}[\mathbf{g}_i(t) - \mathbf{D}^{nb}\mathbf{d}_i^{nb}(t)]$$

$$\delta d_i^b(t) = -(\mathbf{D}^b)^{-1}\mathbf{D}^{nb}\delta \mathbf{d}_i^{nb}(t)$$

$$u_i^h(x,t) = \mathbf{N}^b(x)(\mathbf{D}^b)^{-1}\mathbf{g}_i(t)$$
$$+ [\mathbf{N}^{nb}(x) - \mathbf{N}^b(x)(\mathbf{D}^b)^{-1}\mathbf{D}^{nb}]\mathbf{d}_i^{nb}(t)$$

$$\delta u_i^h(x,t) = [\mathbf{N}^{nb}(x) - \mathbf{N}^b(x)(\mathbf{D}^b)^{-1}\mathbf{D}^{nb}]\delta \mathbf{d}_i^{nb}(t)$$

For all $x_I \in \Gamma^u$ (Boundary Nodes)

$$u_i^h(x_I,t) = g_{iI}(t); \quad \delta u_i^h(x_I,t) = 0; \quad I = 1,\ldots,N_b$$

$$u_i^h(x,t) = \sum_{I=1}^{N_b} \mathbf{W}_I^b(x)\mathbf{d}_{iI}^b(t) + \sum_{I=1}^{N_{nb}} \mathbf{W}_I^{nb}(x)\mathbf{d}_{iI}^{nb}(t)$$

$$= \mathbf{W}^b(x)\mathbf{d}_i^b(t) + \mathbf{W}^{nb}(x)\mathbf{d}_i^{nb}(t)$$

where $$\mathbf{W}^b(x) := \mathbf{N}^b(x)(\mathbf{D}^b)^{-1}$$

and $$\mathbf{W}^{nb}(x) := \mathbf{N}^{nb}(x) - [\mathbf{N}^b(x)(\mathbf{D}^b)^{-1}\mathbf{D}^{nb}]$$

$$u_i(\boldsymbol{x}) \approx u_i^h(\boldsymbol{x}) = u_{FEA}^h(\boldsymbol{x}) + u_{Meshfree}^h(\boldsymbol{x})$$

$$u_{FEA}^h(\boldsymbol{x}) = \sum_L^{KP} \Phi_L^{[m]}(\boldsymbol{x}) d_{iL}$$
$$x_L \in \Omega_{FEA}$$

$$u_{Meshfree}^h(\boldsymbol{x}) = \sum_I^{NP} \overline{w}_a^{[n]}(\boldsymbol{x}; \boldsymbol{x} - \boldsymbol{x}_I) d_{iI} + \sum_L^{MP} \Phi_L^{[m]}(\boldsymbol{x}) d_{iL}$$
$$x_I \in \Omega_{Mesh-free} \qquad\qquad x_L \in \Gamma_{Interface}$$

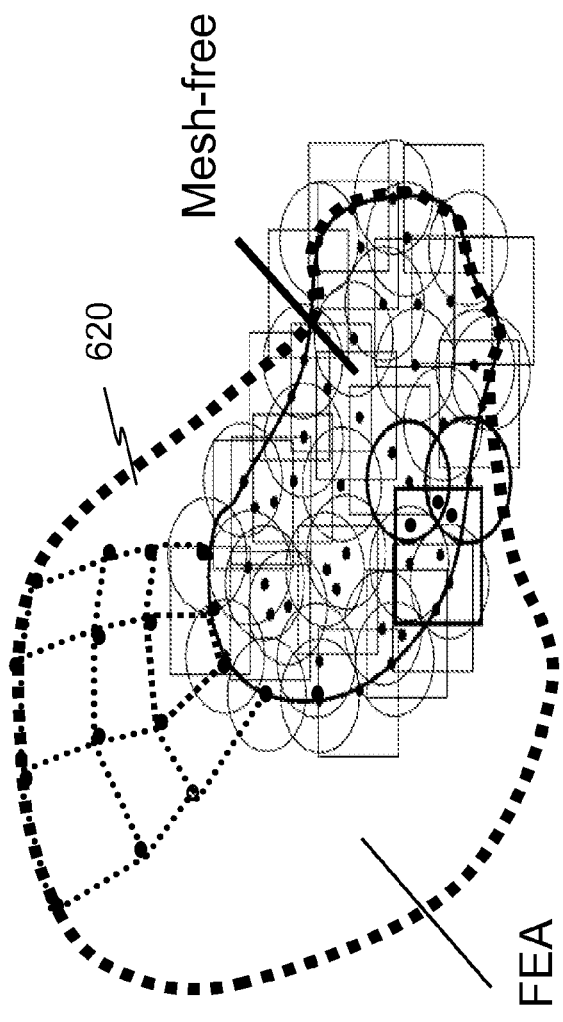

FIG. 6B $$u_i^h(x) \approx \sum_I^{NP} \overline{w}_a^{[n]}(x; x - x_I) d_{iI} + \sum_L^{MP} \Phi_L^{[m]}(x; x - x_L) d_{iL}$$

$$\overline{w}_a^{[n]}(x; x - x_I) = C^{[n]}(x) w_a(x - x_I)$$

$$C^{[n]}(x) = \mathbf{H}^{[n]T}(x - x_I) \mathbf{b}^{[n]}(x)$$

$$\mathbf{H}^{[n]T}(x - x_I) = [1, x_1 - x_{1I}, x_2 - x_{2I}, x_3 - x_{3I}, \ldots, (x_{nsd} - x_{nsdI})^n]$$

632

FIG. 6C $$u_i^h(x) = \sum_I^{NP} \mathbf{H}^{[n]T}(0)\mathbf{M}^{[n]-1}(x)\mathbf{H}^{[n]}(x-x_I)w_a(x-x_I)d_{iI}$$

$$-\sum_L^{MP} \mathbf{H}^{[n]T}(x-x_L)\mathbf{M}^{[n]-1}(x)\mathbf{H}^{[n]}(x-x_L)\Phi_L^{[m]}(x;x-x_L)w_a(x-x_L)d_{iL}$$

$$\equiv \sum_I^{NP} \tilde{\Psi}_I(x)d_{iI} + \sum_L^{MP} \tilde{\Phi}_L^{[m]}(x)d_{iL}$$

642

$$\tilde{\Psi}_I(x) = \mathbf{H}^{[n]T}(0)\mathbf{M}^{[n]-1}(x)\mathbf{H}^{[n]}(x-x_I)w_a(x-x_I)$$

$$\tilde{\Phi}_L^{[m]}(x) = -\mathbf{H}^{[n]T}(x-x_L)\mathbf{M}^{[n]-1}(x)\mathbf{H}^{[n]}(x-x_L)\Phi_L^{[m]}(x;x-x_L)w_a(x-x_L)$$

$$\text{where} \quad \mathbf{M}^{[n]}(x) = \sum_I^{NP} \mathbf{H}^{[n]}(x-x_I)\mathbf{H}^{[n]T}(x-x_I)$$

$$\mathbf{x}(\xi,\eta,\varsigma) = \bar{\mathbf{x}}(\xi,\eta) + \mathbf{V}(\xi,\eta,\varsigma)$$

$$\approx \sum_{I=1}^{NP} \tilde{\Psi}_I(\xi,\eta)\mathbf{x}_I + \varsigma \sum_{I=1}^{NP} \tilde{\Psi}_I(\xi,\eta)\frac{h_I}{2}\mathbf{V}_{3I}$$

$$\mathbf{u}(\xi,\eta,\varsigma) = \bar{\mathbf{u}}(\xi,\eta) + \mathbf{U}(\xi,\eta,\varsigma)$$

$$\approx \sum_{I=1}^{NP} \tilde{\Psi}_I(\xi,\eta)\mathbf{u}_I + \varsigma \sum_{I=1}^{NP} \tilde{\Psi}_I(\xi,\eta)\frac{h_I}{2}[-\mathbf{V}_{2I}\ \mathbf{V}_{1I}]\begin{Bmatrix}\alpha_I\\ \beta_I\end{Bmatrix}$$

⎯ 852

$$\begin{Bmatrix}\alpha\\ \beta\end{Bmatrix} = \begin{bmatrix}\mathbf{V}_1^T\\ \mathbf{V}_2^T\end{bmatrix}\Delta\boldsymbol{\theta}, \qquad \Delta\boldsymbol{\theta} = [\Delta\theta_1\ \Delta\theta_2\ \Delta\theta_3]^T$$

$$\tilde{\varepsilon}^m = \sum_I \tilde{B}_I^m d_I \quad \tilde{\varepsilon}^b = \zeta \sum_I \tilde{B}_I^b d_I \quad \tilde{\varepsilon}^s = \sum_I \tilde{B}_I^s d_I$$

862

$$\tilde{B}_I^m(x_l) = \frac{1}{A_l} \int_{\Omega_l} \hat{B}_I^m d\Omega = \frac{1}{A_l} \int_{\Gamma_l} \hat{B}_I^m \cdot n d\Gamma$$

$$\tilde{B}_I^b(x_l) = \frac{1}{A_l} \int_{\Omega_l} \hat{B}_I^b d\Omega = \frac{1}{A_l} \int_{\Gamma_l} \hat{B}_I^b \cdot n d\Gamma$$

$$\tilde{B}_I^s(x_L) = \frac{1}{A_L} \int_{\Omega_L} \hat{B}_I^s d\Omega = \frac{1}{A_L} \int_{\Gamma_L} \hat{B}_I^s \cdot n d\Gamma$$

866

$$d_I = \begin{bmatrix} u_{xI} & u_{yI} & u_{zI} & \alpha_I & \beta_I \end{bmatrix}^T$$

$$\hat{\mathbf{B}}_I^m = \begin{bmatrix} \tilde{\Psi}_{I,x} & 0 & 0 & -J_{13}^{-1}\tilde{\Psi}_I \dfrac{h_I \hat{V}_{2xI}}{2} & J_{13}^{-1}\tilde{\Psi}_I \dfrac{h_I \hat{V}_{1xI}}{2} \\ 0 & \tilde{\Psi}_{I,y} & 0 & -J_{23}^{-1}\tilde{\Psi}_I \dfrac{h_I \hat{V}_{2yI}}{2} & J_{23}^{-1}\tilde{\Psi}_I \dfrac{h_I \hat{V}_{1yI}}{2} \\ \tilde{\Psi}_{I,y} & \tilde{\Psi}_{I,x} & 0 & -J_{23}^{-1}\tilde{\Psi}_I \dfrac{h_I \hat{V}_{2xI}}{2} - J_{13}^{-1}\tilde{\Psi}_I \dfrac{h_I \hat{V}_{2yI}}{2} & J_{23}^{-1}\tilde{\Psi}_I \dfrac{h_I \hat{V}_{1xI}}{2} + J_{13}^{-1}\tilde{\Psi}_I \dfrac{h_I \hat{V}_{1yI}}{2} \end{bmatrix}$$

$$\hat{\mathbf{B}}_I^b = \begin{bmatrix} 0 & 0 & 0 & -\tilde{\Psi}_{I,x} \dfrac{h_I \hat{V}_{2xI}}{2} & \tilde{\Psi}_{I,x} \dfrac{h_I \hat{V}_{1xI}}{2} \\ 0 & 0 & 0 & -\tilde{\Psi}_{I,y} \dfrac{h_I \hat{V}_{2yI}}{2} & \tilde{\Psi}_{I,y} \dfrac{h_I \hat{V}_{1yI}}{2} \\ 0 & 0 & 0 & -\tilde{\Psi}_{I,y} \dfrac{h_I \hat{V}_{2xI}}{2} - \tilde{\Psi}_{I,x} \dfrac{h_I \hat{V}_{2yI}}{2} & \tilde{\Psi}_{I,y} \dfrac{h_I \hat{V}_{1xI}}{2} + \tilde{\Psi}_{I,x} \dfrac{h_I \hat{V}_{1yI}}{2} \end{bmatrix}$$

$$\hat{\mathbf{B}}_I^s = \begin{bmatrix} 0 & 0 & \tilde{\Psi}_{I,y} & -J_{33}^{-1}\tilde{\Psi}_I \dfrac{h_I \hat{V}_{2xI}}{2} - \tilde{\Psi}_{I,y} \dfrac{h_I \hat{V}_{2zI}}{2} & J_{33}^{-1}\tilde{\Psi}_I \dfrac{h_I \hat{V}_{1yI}}{2} + J_{23}^{-1}\tilde{\Psi}_I \dfrac{h_I \hat{V}_{1zI}}{2} \\ 0 & 0 & \tilde{\Psi}_{I,x} & -J_{33}^{-1}\tilde{\Psi}_I \dfrac{h_I \hat{V}_{2yI}}{2} - \tilde{\Psi}_{I,x} \dfrac{h_I \hat{V}_{2zI}}{2} & J_{33}^{-1}\tilde{\Psi}_I \dfrac{h_I \hat{V}_{1xI}}{2} + J_{13}^{-1}\tilde{\Psi}_I \dfrac{h_I \hat{V}_{1zI}}{2} \end{bmatrix}$$

872

FIG. 8H $$\hat{\mathbf{K}}_{IJ}^{M} = \hat{\mathbf{K}}_{IJ}^{m} + \hat{\mathbf{K}}_{IJ}^{b} + \hat{\mathbf{K}}_{IJ}^{s} = \int_{\Omega} \tilde{\mathbf{B}}_{I}^{m\,T} \mathbf{C}^{m} \tilde{\mathbf{B}}_{J}^{m} d\Omega + \int_{\Omega} \tilde{\mathbf{B}}_{I}^{s\,T} \mathbf{C}^{s} \tilde{\mathbf{B}}_{J}^{s} d\Omega$$
$$+ \int_{\Omega} \tilde{\mathbf{B}}_{I}^{b\,T} \zeta^{2} \mathbf{C}^{b} \tilde{\mathbf{B}}_{J}^{b} d\Omega$$

— 874

$$\hat{\mathbf{K}}_{IJ}^{G} = \int_{\Omega} \tilde{\mathcal{B}}_{kI}^{0\,T} \hat{\sigma}_{kl} \tilde{\mathcal{B}}_{lJ}^{0} d\Omega + \int_{\Omega} \tilde{\mathcal{B}}_{kI}^{0\,T} \zeta \hat{\sigma}_{kl} \tilde{\mathcal{B}}_{lJ}^{1} d\Omega$$
$$+ \int_{\Omega} \tilde{\mathcal{B}}_{kI}^{1\,T} \zeta \hat{\sigma}_{kl} \tilde{\mathcal{B}}_{lJ}^{0} d\Omega + \int_{\Omega} \tilde{\mathcal{B}}_{kI}^{1\,T} \zeta^{2} \hat{\sigma}_{kl} \tilde{\mathcal{B}}_{lJ}^{1} d\Omega$$

— 875

$$f_{I}^{int} = \int_{\Omega} \tilde{\mathbf{B}}_{I}^{m\,T} \hat{\sigma} d\Omega + \int_{\Omega} \tilde{\mathbf{B}}_{I}^{b\,T} \zeta \hat{\sigma} d\Omega + \int_{\Omega} \tilde{\mathbf{B}}_{I}^{s\,T} \hat{\sigma} d\Omega$$

$$\tilde{\mathcal{B}}^0_{kI} = \begin{bmatrix} \tilde{\Psi}_{I,k} & 0 & 0 & 0 & -J^{-1}_{k3}\tilde{\Psi}_I\dfrac{h_I}{2}\hat{V}_{2xI} & J^{-1}_{k3}\tilde{\Psi}_I\dfrac{h_I}{2}\hat{V}_{1xI} \\ 0 & \tilde{\Psi}_{I,k} & 0 & 0 & -J^{-1}_{k3}\tilde{\Psi}_I\dfrac{h_I}{2}\hat{V}_{2yI} & J^{-1}_{k3}\tilde{\Psi}_I\dfrac{h_I}{2}\hat{V}_{1yI} \\ 0 & 0 & \tilde{\Psi}_{I,k} & -J^{-1}_{k3}\tilde{\Psi}_I\dfrac{h_I}{2}\hat{V}_{2zI} & J^{-1}_{k3}\tilde{\Psi}_I\dfrac{h_I}{2}\hat{V}_{1zI} \end{bmatrix}$$

$$\tilde{\mathcal{B}}^1_{kI} = \begin{bmatrix} 0 & 0 & 0 & -\tilde{\Psi}_{I,k}\dfrac{h_I}{2}\hat{V}_{2xI} & \tilde{\Psi}_{I,k}\dfrac{h_I}{2}\hat{V}_{1xI} \\ 0 & 0 & 0 & -\tilde{\Psi}_{I,k}\dfrac{h_I}{2}\hat{V}_{2yI} & \tilde{\Psi}_{I,k}\dfrac{h_I}{2}\hat{V}_{1yI} \\ 0 & 0 & 0 & -\tilde{\Psi}_{I,k}\dfrac{h_I}{2}\hat{V}_{2zI} & \tilde{\Psi}_{I,k}\dfrac{h_I}{2}\hat{V}_{1zI} \end{bmatrix} \phantom{xxx} \underset{878}{\swarrow}$$

FIG. 8J

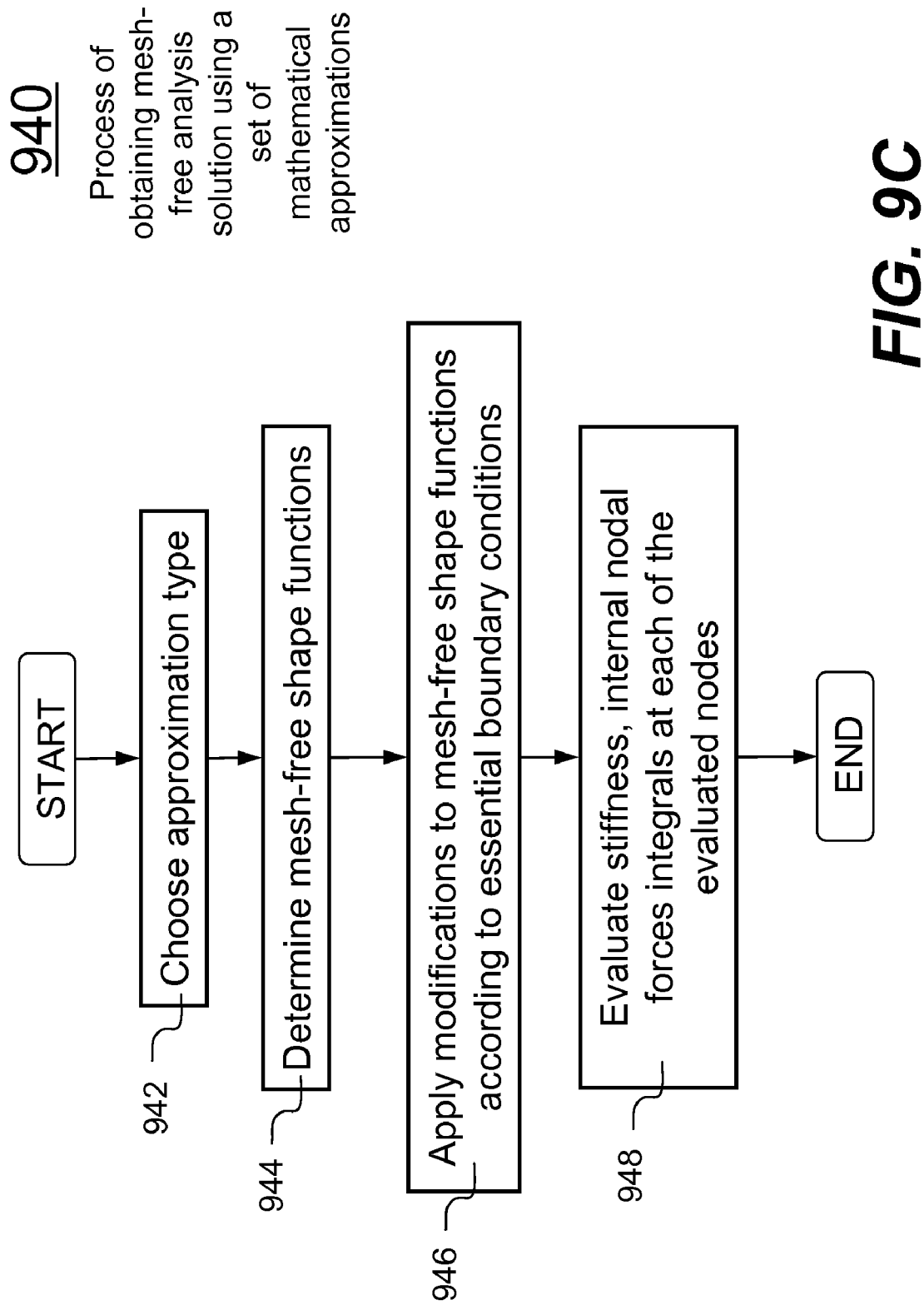

METHOD AND SYSTEM FOR MESH-FREE ANALYSIS OF GENERAL THREE-DIMENSIONAL SHELL STRUCTURES

BACKGROUND OF THE INVENTION

1. Field of the Invention

The present invention generally relates to method, system and computer program product used in engineering analysis, more particularly to numerical simulation of the non-linear structural behaviors of a general three-dimensional (3-D) shell structures based on mesh-free analysis.

2. Description of the Related Art

Finite element analysis (FEA) is a computerized method widely used in industry to model and solve engineering problems relating to complex systems since its invention in late 1950's. With the advent of the modern digital computer, FEA has been implemented as FEA computer program product. Basically, the FEA computer program product is provided with a model of the geometric description and the associated material properties at each point within the model. In this model, the geometry of the system under analysis is represented by solids, shells and beams of various sizes, which are called elements. The vertices of the elements are referred to as nodes. The individual elements are connected together by a topological map, which is usually called mesh. The model is comprised of a finite number of elements, which are assigned a material name to associate with material properties. The model thus represents the physical space occupied by the object under analysis along with its immediate surroundings. The FEA computer program product then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

FEA computer program product can be classified into two general types, implicit analysis computer program product and explicit analysis computer program product. The implicit analysis computer program product uses an implicit equation solver to solve a system of coupled linear equations. Such computer program product is generally used to simulate static or quasi-static problems. Explicit computer program product does not solve coupled equations but explicitly solves for each unknown assuming them uncoupled. The explicit analysis computer program product usually uses central difference time integration which requires very small solution cycles or time steps for the method to be stable and accurate. The explicit analysis computer program product is generally used to simulate short duration events where dynamics are important such as impact type events.

Although FEA has been successfully applied to many fields to simulate various engineering problems, there are some instances that FEA may not be advantageous due to numerical compatibility condition is not the same as the physical compatibility condition of a continuum. For example, in Lagrangian type of computations, one may experience mesh distortion, which can either end the computation altogether or result in dramatic deterioration of accuracy. In addition, the FEA often requires a very fine mesh in problems with high gradients or a distinct local character, which can be computationally expensive. For this reason, adaptive FEA has been developed.

Adaptive re-meshing procedures for simulations of impact/penetration problems, explosion/fragmentation problems, flow pass obstacles, and fluid-structure interaction problems etc., have become formidable tasks to undertake. The difficulties here are not only re-meshing, but also mapping the state variables from the old mesh to the new mesh. Hence, this process often introduces numerical errors; frequent re-mesh is not desirable. Another procedure called Arbitrary Lagrangian Eulerian (ALE) formulations has been developed. Its objective is to move the mesh independently of the material so that the mesh distortion can be minimized. Unfortunately, the mesh distortion still creates severe numerical errors for very large strain and high speed mechanical simulations. In other cases, a mesh may carry inherent bias in numerical simulations, and its presence becomes a nuisance in computations. An example is the strain localization problem, which is notorious for its mesh alignment sensitivity. Therefore it is computationally efficacious to discretize a continuum by a set of nodal points without mesh constraints.

The mesh-free analysis has become one of the focused research topics during the 1990's. Many applications of using mesh-free analysis have been achieved in the past decade. Today, the vast majority of the engineering applications using mesh-free analysis are related to two-(2-D) and three-dimensional (3-D) solid structures. It is well known amongst the skilled in the art of engineering analysis that the mesh-free analysis would not be practical if the mesh-free analysis could only handle solid structures. Many of the mechanical structures contain shells or plates such as the structure and the components of an automobile. Therefore, it would be desirable to have the capability to analyze to a general 3-D shell structures using mesh-free analysis. In particular, it would be extremely desirable for the mesh-free analysis to handle shell structure involving material and geometrical non-linearity.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In general, the present invention pertains to engineering analysis of a general three-dimensional (3-D) shell structure using the mesh-free technique. The engineering analysis includes both geometric and material non-linear responses of the general 3-D shell structure. In particular, the general 3-D shell structure represented by a set of nodes is mapped to a two-dimensional plane first. The structural responses are then calculated with the mesh-free technique. According to one aspect, the present invention is a method for mesh-free analysis of a general three-dimensional shell structure, the method comprises: defining the general shell structure as a physical domain represented by a plurality of nodes in a three-dimensional space, creating a plurality of projected nodes by mapping the plurality of nodes in the three-dimensional space onto a two-dimensional plane, assigning a plurality of domain of influences, one for each of the plurality of projected nodes, and calculating a solution of the physical domain using a set of mathematical approximations pertaining to each of the plurality of projected nodes.

According to another aspect, the present invention further comprises: establishing a background mesh representing a reference surface describing the general shell structure, and mapping the reference surface onto the two-dimensional space based on one of the two particular schemes: a global projection that maps all elements of the background mesh in one projection operation based on minimization of angle distortion globally, and a local projection procedure that maps each element of the background mesh to the two-dimensional plane one at the time.

According to yet another aspect, the present invention is a computer program product including a computer usable medium having computer readable code embodied in the medium for causing an application module to execute on a computer for mesh-free analysis of a general three-dimensional shell structure, the computer program product comprises: computer readable code for defining the general shell structure as a physical domain representing by a plurality of nodes in a three-dimensional space, computer readable code for creating a plurality of projected nodes by mapping the plurality of nodes in the three-dimensional space onto a two-dimensional plane, computer readable code for assigning a plurality of domain of influences, one for each of the plurality of projected nodes, and computer readable code for calculating a solution of the physical domain using a set of approximations pertaining to each of the plurality of projected nodes.

One of the objects, features, and advantages of the present invention is to be capable of analyzing a general 3-D shell structure with geometric and material non-linearity using the mesh-free analysis.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 1B depicts an exemplary network environment that another embodiment of the present invention may be implemented.

FIGS. 4A-D show the summary of an exemplary set of mathematical approximations for the solution employed in the mesh-free analysis according to one embodiment of the present invention.

FIG. 4E shows a graphical display of an exemplary shape function employed in the mesh-free analysis according to one embodiment of the present invention.

FIG. 4F shows an exemplary shape function in discrete form employed in the mesh-free analysis according to one embodiment of the present invention.

FIGS. 5A-D show the summary equations of an exemplary modifications to the mesh-free shape function to accommodate the essential boundary conditions in accordance with one embodiment of the present invention.

FIGS. 6B-D show the summary of the mathematical modifications to the mesh-free shape functions in the interface between the FEA zone and mesh-free zone of an exemplary coupled FEA and mesh-free model in accordance with one embodiment of the present invention.

FIGS. 8E-J show the equations to the solutions of the mesh-free analysis for the shell employed for an exemplary shell theory according to embodiments of the present invention.

FIG. 9C shows a flowchart or process for obtaining a mesh-free analysis solution of a projected 2-D shell using a set of mathematical approximations in accordance with one embodiment of the present analysis.

DETAILED DESCRIPTION OF THE PREFERRED EMBODIMENTS

Figure 1A:
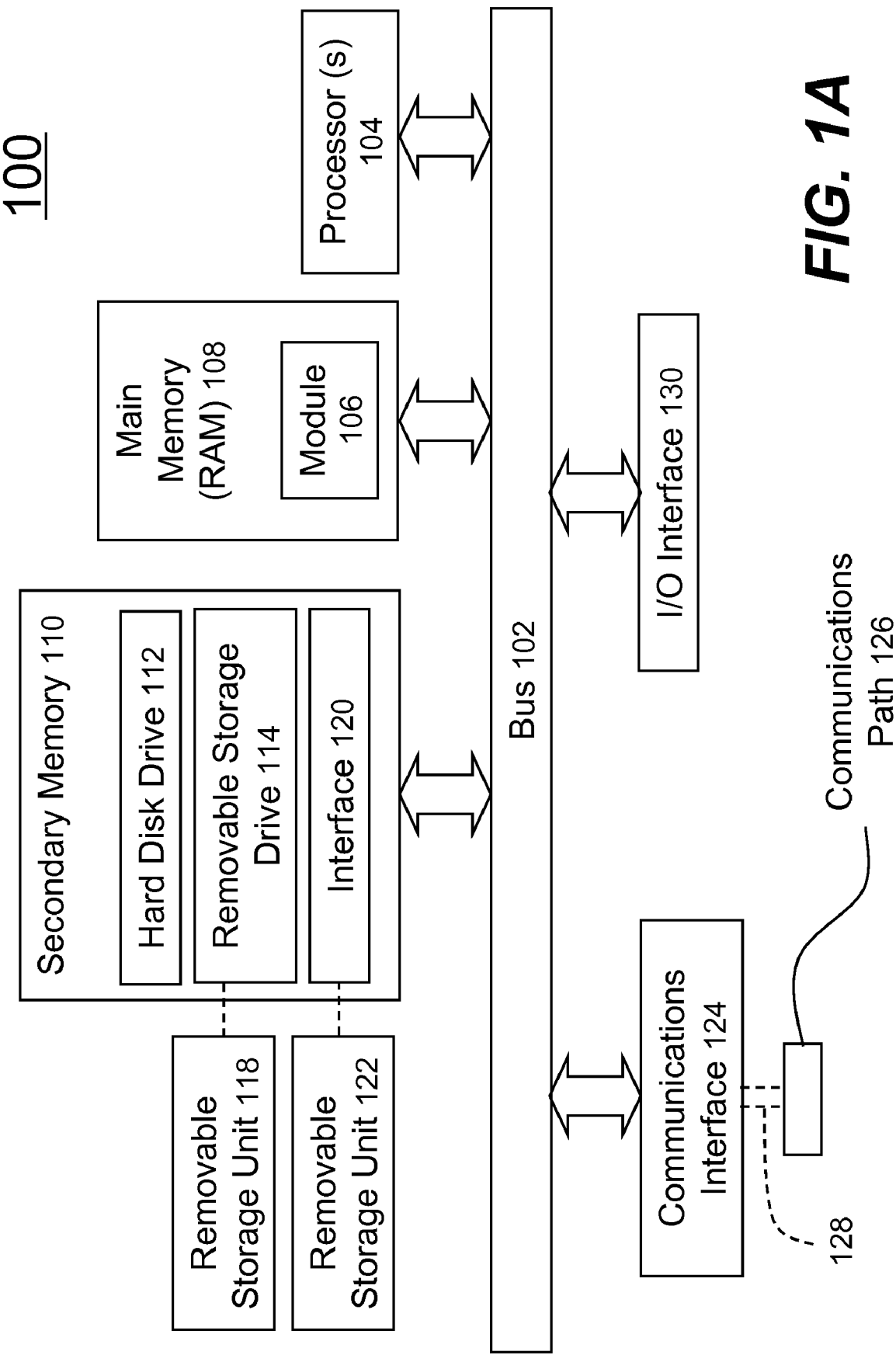
FIG. 1A depicts a block diagram of an exemplary computer, in which one embodiment of the present invention may be implemented.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

FEM stands for Finite Element Method, which is used interchangeably with FEA hereinafter.

Implicit analysis refers to K x=F, where K is the global stiffness matrix, x is the unknown displacement array and F is the global force array.

Explicit analysis refers to M a=F, where M is the mass array, a is the acceleration array and F is the global force array.

Time domain analysis refers to an engineering analysis that simulates a physical phenomenon progressing in time.

Solution cycle and cycle are used interchangeably to refer to the numbered solution states starting with cycle 0 at time 0.

The time step refers to an interval of time between subsequent cycles.

Essential boundary condition is defined such as the structural constraints on a model.

Shell and plate are used interchangeably hereinafter.

Node, node point and point are used interchangeably hereinafter.

Boundary and border are used interchangeably hereinafter.

Domain of influence and support of a node in the mesh-free model are used interchangeably hereinafter.

Computer, computer system, and computing device are used interchangeably hereinafter.

Embodiments of the present invention are discussed herein with reference to FIGS. 1A-9C. However, those skilled in the art will readily appreciate that the detailed description given herein with respect to these figures is for explanatory purposes as the invention extends beyond these limited embodiments.

Referring now to the drawings, in which like numerals refer to like parts throughout several views. The present invention may be implemented using hardware, software or a combination thereof and may be implemented in a computer system or other processing system. In fact, in one embodiment, the invention is directed toward one or more computer systems capable of carrying out the functionality described herein. An example of a computer system 100 is shown in FIG. 1A. The computer system 100 includes one or more processors, such as processor 104. The processor 104 is connected to a computer system internal communication bus 102. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as an EPROM, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services. Exemplary OS includes Linux®, Microsoft Windows®.

There may also be a communications interface 124 connecting to the bus 106. Communications interface 124 allows software and data to be transferred between computer system 100 and external devices. Examples of communications interface 124 may include a modem, a network interface (such as an Ethernet card), a communications port, a PCMCIA slot and card, etc.

The channel 126 facilitates a data flow 128 between a data network (e.g. 150 in FIG. 1B) and the computer 100 and typically executes a special set of rules (i.e., a protocol) to send data back and forth. One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100.

In this document, the terms "computer program medium" and "computer usable medium" are used to generally refer to media such as removable storage drive 114, and/or a hard disk installed in hard disk drive 112. These computer program products are means for providing software to computer system 100. The invention is directed to such computer program products.

The computer system 100 may also include an I/O interface 130, which provides the computer system 100 to access monitor, keyboard, mouse, printer, scanner, plotter, and a like.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform the features of the present invention. Accordingly, such computer programs represent controllers of the computer system 100.

In an embodiment where the invention is implemented using software, the software may be stored in a computer program product and loaded into computer system 100 using removable storage drive 114, hard drive 112, or communications interface 124. The application module 106, when executed by the processor 104, causes the processor 104 to perform the functions of the invention as described herein.

In another embodiment, the present invention is implemented primarily in hardware using, for example, hardware components such as application specific integrated circuits (ASICs). Implementation of the hardware state machine so as to perform the functions described herein will be apparent to persons skilled in the relevant art(s). In yet another embodiment, the present invention is implemented using a combination of both hardware and software.

The main memory 108 may be loaded with one or more application modules 106 that can be executed by. one or more processors 104 with or without a user input through the I/O interface 130 to achieve desired tasks. In one embodiment, an application module is configured to facilitate representing the physical domain of an engineering problem to be analyzed with a plurality of nodes with associated domain of influence at each node in mesh-free analysis. In another embodiment, the application module is configured to facilitate calculating the solution using a set of mathematical approximations. In yet another embodiment, the application module is configured to facilitate mapping a general three-dimensional (3-D) shell structure from a 3-D space into a two- dimensional (2-D) plane. In operation, when at least one processor 104 executes one of the application modules 106, the results are computed and stored in the secondary memory 110 (i.e., hard disk drive 112). The status of the computation (e.g., the progress of a time-domain simulation) is reported to the user via the I/0 interface 130. The current deformed structure may be shown graphically for visual inspection. The graphical output is sent through the I/O interface 130 to a monitor.

FIG. 1B depicts a networked computing environment 140, in which one embodiment of the present invention may be practiced. A plurality of network capable computing devices 152, 154, 156, 158 and 160 (e.g., the computer device 100 described in FIG. 1A) are coupled to a data network 150. These computing devices 152-160 can communicate with each other via the network 150. The data network 150 may include, but is not limited to, the Internet, an Intranet, local area network (LAN), wide area network (WAN), a wireless network or a data network comprises of public and private networks. In one embodiment, the application module (i.e., 106 in FIG. 1A) for the mesh-free analysis is configured and executed on the computing device 160. A user may prepare an input file describing the physical domain of an engineering problem on a personal workstation computing device 152. The input file is then sent to the computing device 160 via the network 150 to facilitate the computation of mesh-free analysis. During the execution of the application module, the user may be able to monitor the progress of the analysis at another computing device 156. Finally after the analysis is completed, the user may examine the computed results by retrieving the stored result file from the computer 160 to any one of the computing devices 152, 154 or 156 for a post-processing, which in general includes a graphical representation of the analysis results.

In one embodiment, the input file includes the description of the physical domain represented by a plurality of nodes in 3-D space. For a general 3-D shell structure, a background mesh such as FEA model may be used to represent the shell structure. The 3-D mesh is then mapped to a 2-D plane. A global projection maps the entire mesh with one angle distortion optimization. A local projection procedure maps one element at a time from the background mesh to the 2-D plane. All neighboring nodes belonging to the surrounding elements are mapped together with the projected element in each of the local projections. Each of the projected nodes is assigned with a domain of influence or support. The mesh-free shape functions are modified to accommodate the essential boundary conditions for the particular analysis. With a particular type of mathematical approximations, the solution of the physical domain is calculated with the specific sequence of the instructions built within the application module (e.g., mesh-free analysis module). In another embodiment, the input file includes both mesh-free model and FEA mesh as a mesh-free/FEA coupling model for a computer based engineering analysis. One exemplary implementation of this technique is included in a well-known engineering computer program product application, LS-DYNA™, offered by Livermore Software Technology Corporation.

Figure 2:
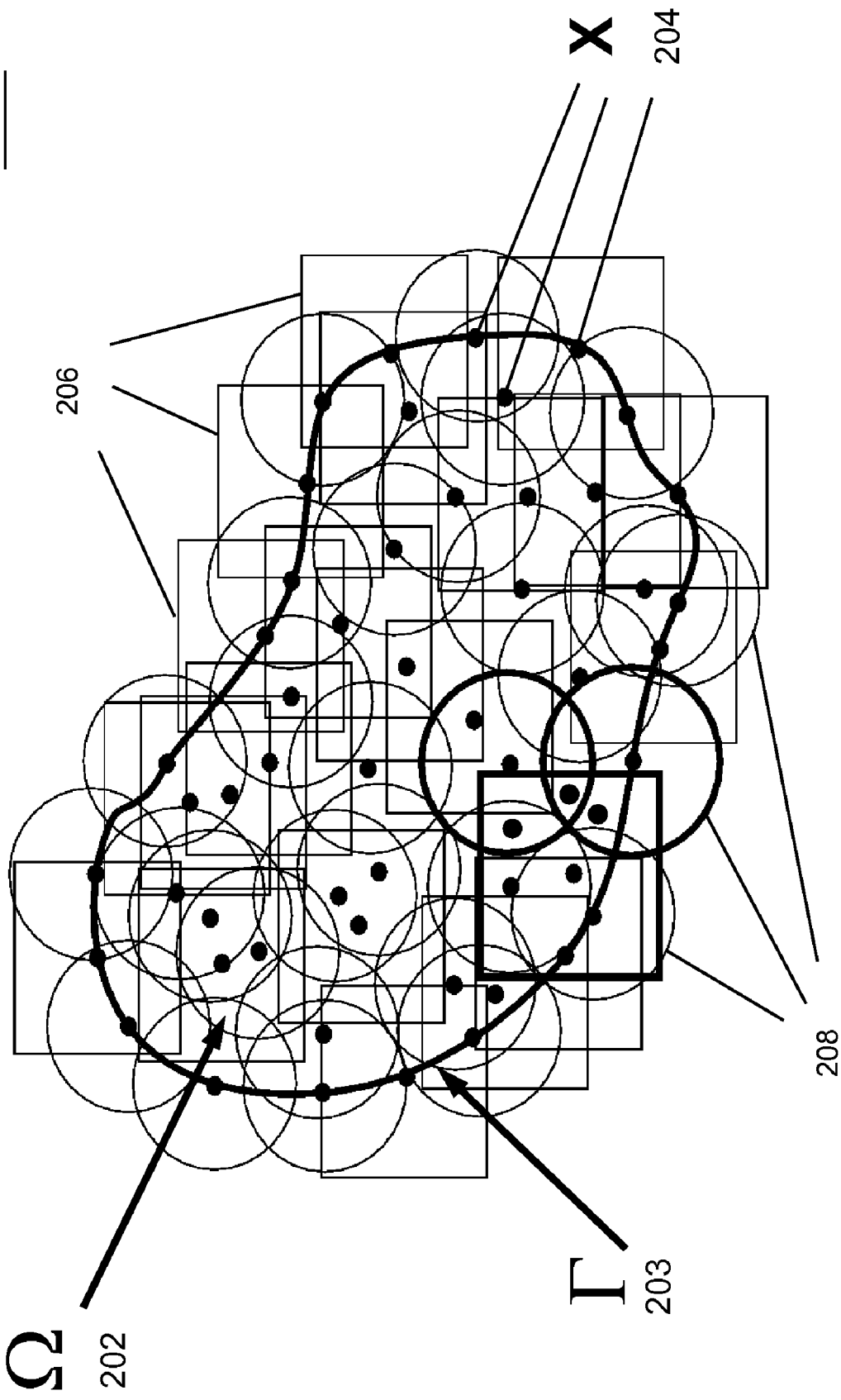
FIG. 2 shows an exemplary mesh-free analysis model in accordance with one embodiment of the present invention.

Referring now to FIG. 2, an exemplary mesh-free model 200 is shown in accordance with one embodiment of the present invention. An exemplary physical domain Ω 202 and the corresponding boundary or border Γ 203 are depicted in FIG. 2. To represent the physical domain 202, a plurality of nodes 204 are used. The nodes representing the physical domain do not have a particular pattern. They may be regularly spaced or in random locations. These nodes may be located in the interior or on the boundary of the physical domain. Each of the nodes 204 contains a domain of influence or support 206 and 208. The domain of influence and the support are used interchangeably hereinafter. The size and shape of the support for each node are also arbitrary. In one embodiment, the shape of the support is quadrilateral 206. In another embodiment, the shape is circular 208. In the case of three-dimensional support, the shape of the support may be spherical in that embodiment. In yet another embodiment, the size and the shape of each node are different. One node may have a one square foot support while another node may have a 16-in radius circular support in the same model. In yet another embodiment, the support is not a regular geometric shape. It can be any arbitrary shape. The present invention can support all different combinations.

In one embodiment, because of the flexibility of the present invention regarding the nodal representation 204 of the physical domain 202, a practical way to create a computer model for the mesh-free analysis is to use the FEA nodal data that is readily generated from a pre-processing software package. The pre-processing software may be a stand-alone software package or a built-in portion of an engineering design or analysis computer program product package.

Figure 3:
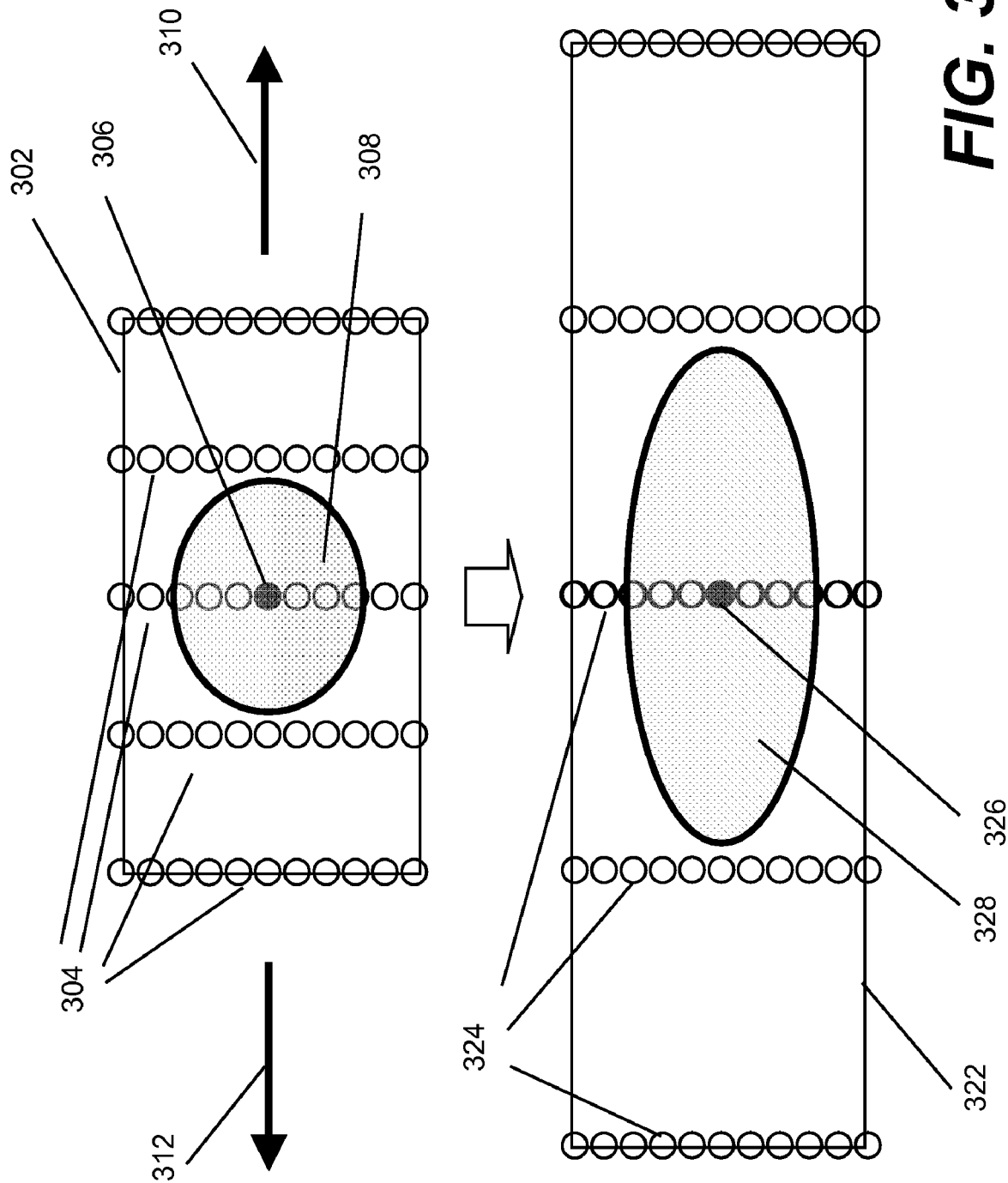
FIG. 3 shows an exemplary domain of influence at initial and deformed configurations according to one embodiment of the present invention.

FIG. 3 shows an exemplary domain of influence in a mesh-free model in the initial and deformed configurations in accordance with one embodiment of the present inventions. An initial physical domain 302 represented by a plurality of nodes 304. In this embodiment, the physical domain 302 is pulled by two equal forces 310 and 312 at each end. The center of the domain 302 is represented by node 306 with a circular support 308 associated with the node 306. Under this loading condition, the initial physical domain is deformed under tension and becomes the current deformed physical domain 322. Accordingly, all of the nodes 304 are deformed horizontally to the current locations 324. Owing to the symmetrical loading condition 310 and 312, as well as the symmetry of the initial physical domain 302, the current location 326 of the center node 306 stays in the center of the current deformed physical domain 322. However, the initial circular support 308 for node 306 will be stretched to an elliptical shape 328. In this embodiment, the support covers the same subset of nodes for all time cycles throughout the time domain analysis. This embodiment is based on Lagrangian kernel for the mathematical approximation to evaluate the solution of physical domain defined in the mesh-free analysis.

In another embodiment based upon the Eulerian kernel, the shape of the support is defined at each solution cycle in a time-domain analysis. At each cycle, the shape of the support may be defined as the same circular shape as the previous cycle. That means the support does not cover the same subset of nodes from one solution cycle to the next.

Figure 4A:
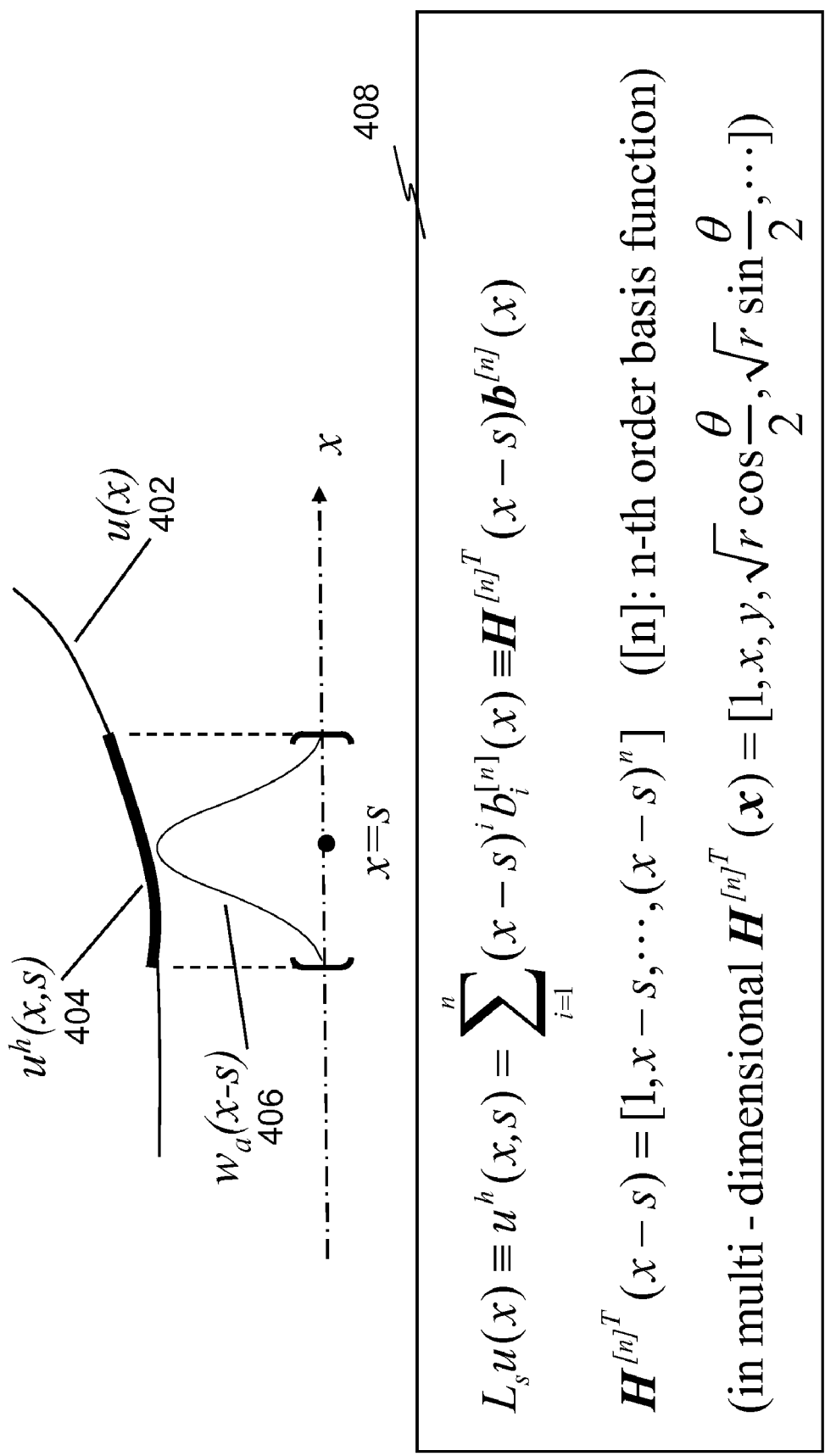

According to one embodiment of the present invention, after the domain of influence of each node in the physical domain is assigned. The solution of the problem u(x) (e.g., displacement, temperature, pressure, etc.) is obtained with a sequence of mathematical approximations. A number of approximations schemes have been used to solve mesh-free analysis during the past decade. One of the approximations schemes is called moving least square (MLS) scheme, which was documented by Lancaster and Salkauskas in 1981. In this embodiment, as shown in FIG. 4A, a local approximation $u^h(x,s)$ 404 of the solution u(x) 402 is listed in equations 408. In FIG. 4B, a weighted $L_2$ norm J(x) is listed as function 412 using a weighting function $w_a(x-s)$ 406 from FIG. 4A. Equation 414 is the result of the minimization of the function J(x). Finally as shown in FIG. 4C, the corresponding stationary condition is shown as functions 422 and the solution $u^h(x)$ is written as equations 424. All the equations presented so far are in continuous form. The corresponding equations in discrete form are shown in FIG. 4D. The discrete form equations 432 are suitable for implementation in an application module for a computer (e.g., 100 in FIG. 1A). A graphical depiction of an exemplary mesh-free shape function 440 is shown in FIG. 4E. It is evident that the shape function has a very smooth shape. In general, the mesh-free shape functions must possess the mathematical properties listed in equations 452 in FIG. 4F. One exemplary set of shape functions is Shepard functions 458 as shown in FIG. 4F. Shepard functions 458 are well-known and commonly used, and are the only mesh-free shape functions that satisfy the 0-th order consistency and can be written explicitly with matrix inversion.

There are a number of other mathematical approximations schemes that may be used for the solution of the physical domain in the present invention. Other embodiments include, but are not limited to, reproducing kernel approximation, the partition of unity method, and the hp-clouds method.

In a mesh-free analysis, one of the biggest challenges is to enforce the essential boundary conditions to the corresponding boundary of the physical domain. Lack of Kronecker delta δ property in the mesh-free shape functions, the mesh-free analysis does not yield the boundary values that are equal to the physical boundary conditions 510 as shown in FIG. 5A. In order to enforce the essential boundary conditions, there have been a number of treatments suggested and tested in the past. These treatments include, but are not limited to, Lagrangian multiplier method, penalty method, transformation method, boundary singular kernel method, D'Alembert principle, and coupled finite element and mesh-free nodes method. In accordance with one embodiment, a detailed summary of the transformation scheme is shown in FIGS. 5B-D. In the transformation scheme, all the nodes are separated into two sets: boundary set marked with superscript or subscript b and interior set marked with nb (non-boundary nodes). The boundary is denoted by $\Gamma^u$, and the number of interior nodes are $N_{nb}=NP-N_b$. NP is total number of nodes in a mesh-free analysis model. $N_b$ is the number of nodes on the boundary. The essential boundary condition providing Nb constraints is shown as equations 520 in FIG. 5B and equations 530 in FIG. 5C. This can be written as the transformation of shape functions 540 as shown in FIG. 5D. It is noted that the new transformed shape functions 540 at the essential boundary possess the Kronecker delta δ property. With the new modified shape functions 540, the essential boundary conditions can be imposed properly.

Figure 6A:
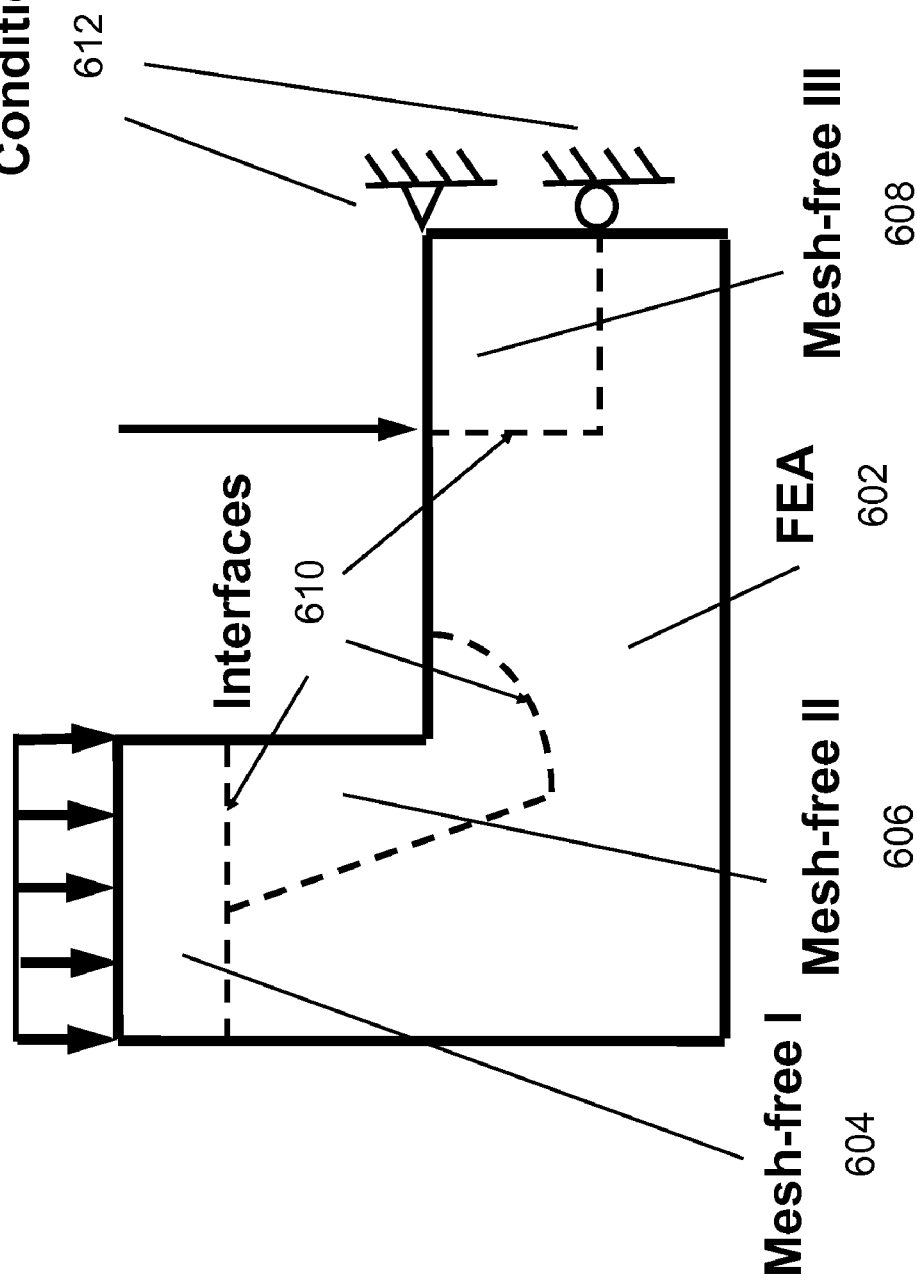
FIG. 6A shows an exemplary coupled FEA and mesh-free model that includes essential boundary conditions in accordance with one embodiment of the present invention.

In another embodiment as shown in FIG. 6A, the essential boundary conditions 612 are applied in a coupled FEA and mesh-free model 602, 604, 606 and 608. Because FEA shape functions possess the correct boundary value, the coupled model approach handles the essential boundary conditions properly. Only the interfaces 610 between the FEA zone 602 and mesh-free zone 604, 606 and 608 of the physical domain needs certain proper modifications to ensure the compatibility, when the shape functions are transition from the FEA zone to the mesh-free zone. To demonstrate the modifications to the shape function for the interface, a FEA/mesh-free model 620 and the corresponding equations for displacement approximation 622 are shown in FIG. 6B. The solution for displacement is divided into three zones: the FEA nodes, the mesh-free interior nodes and the FEA/mesh-free interface nodes. In equations 622, $\Phi_L^{[m]}(x)$ is the shape function for the FEA zone, while $\overline{w}_a^{[m]}(x;x-x_I)$ is the shape function for the mesh-free zone of the physical model. KP is the number of nodal points per finite element (e.g., KP=4 for a quadrilateral element). NP is the number of mesh-free nodes that affect the evaluated node in the mesh-free zone, and MP is the number of mesh-free nodes in the interface zone that affect the evaluated nodes. The interface zone uses the FEA shape functions as a starting approximation, which is modified and transformed into a form that blends into a transition between the FEA and the mesh-free zone of the physical domain. FIG. 6C shows the detailed derivations for the modified solution for the displacement 632 based on reproducing kernel approximation method. The final solution for the displacement is shown as equations 642 in FIG. 6D and the corresponding modified shape functions for the mesh-free zone $\Psi_I(x)$ and the interface zone $\Phi_L^{[m]}(x)$ are shown as equations 644. Therefore, the coupled FEA/mesh-free model can be used for more general engineering analysis such as a car crash simulation.

Referring back to equations 622 in FIG. 6B, superscripts [m] and [n] used in the shape functions indicate the number of terms in the polynomial. In general, the FEA shape functions $\Phi_L^{[m]}(x)$ and mesh-free shape functions $\overline{w}_a^{[n]}(x;x-x_I)$ can use different number of terms such as [m] terms for the FEA and [n] terms for the mesh-free. In one embodiment, [n] is selected to be 1 and [m] is equal to [n].

The above descriptions for the mesh-free method apply to solid continuum in general. For an arbitrary three-dimensional (3-D) shell or plate structure, there are other requirements of different treatments before the mesh-free analysis can be performed. According to one embodiment of the present invention, the 3-D shell surface is represented by a background FEA mesh. This can easily accomplished by converting a part of shell elements into mesh-free zone. With the connectivity of the nodes provided by the finite element mesh, a shell surface can be reconstructed with mesh-free shape function from the nodal positions. The arbitrary 3-D shell surface representation needs to be projected to a 2-D plane. There are a couple of approaches: global parametric representation and local projection representation.

Figure 7A:
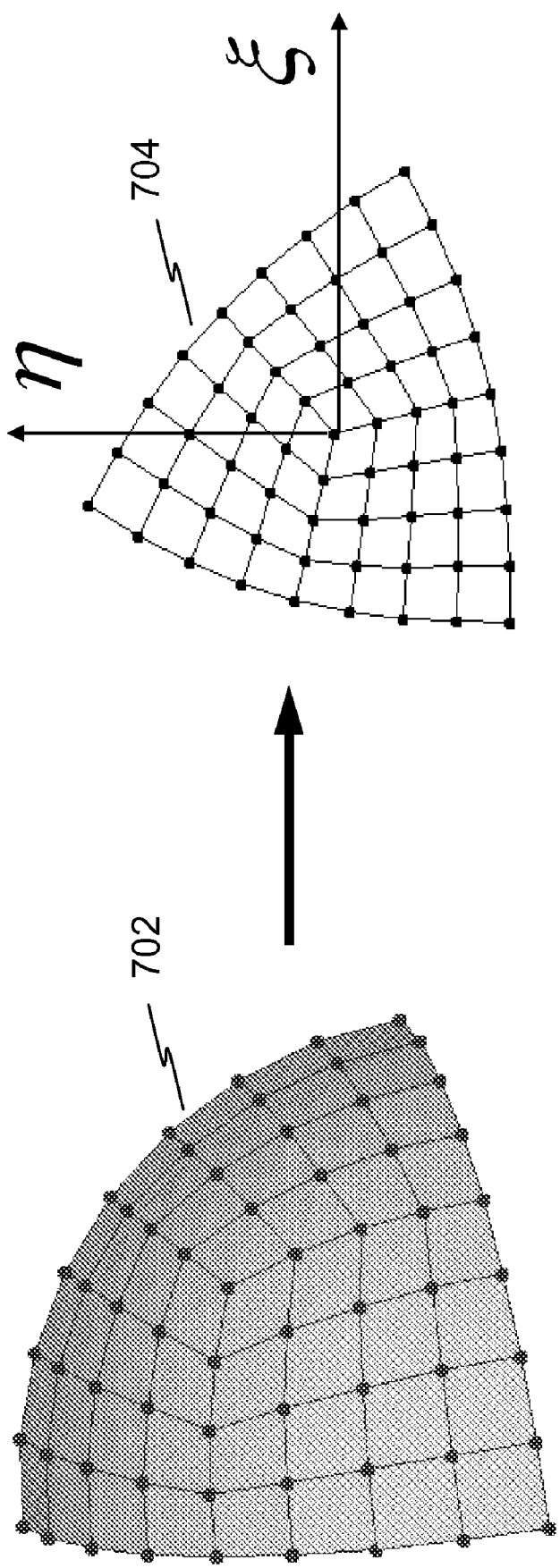
FIG. 7A shows the projection scheme of an exemplary three-dimensional shell structure into a two-dimensional space with a global approach based on the present invention.

One embodiment of the global case is illustrated in FIG. 7A. The whole 3-D shell surface 702 is projected to a 2-D parametric plane 704. In one embodiment, the global projection is based on a triangular flattening algorithm. The idea of the algorithm is to compute a projection that minimizes the relative distortion of the angles in the 2-D parametric plane (ξ,η) with respect to their counterparts in the 3-D reference surface, while satisfying a set of constraints on the angles that ensure the validity of the 2-D flat mesh. In order to account for the curvature at each node in the 3-D reference surface (i.e., the angles around an interior node do not sum to 2π), a scaling factor is applied to all angles in the 3-D reference surface. The distortion is measured relative to the scaled angles. The minimization is entirely based on the angles. The nodal locations on the 3-D reference surface do not affect the minimization. Once the angles are computed after the minimization of the distortion, the 2-D parametric mesh is determined after fixing the position of one interior node and the length and direction of one edge connected to that node.

Figure 7B:
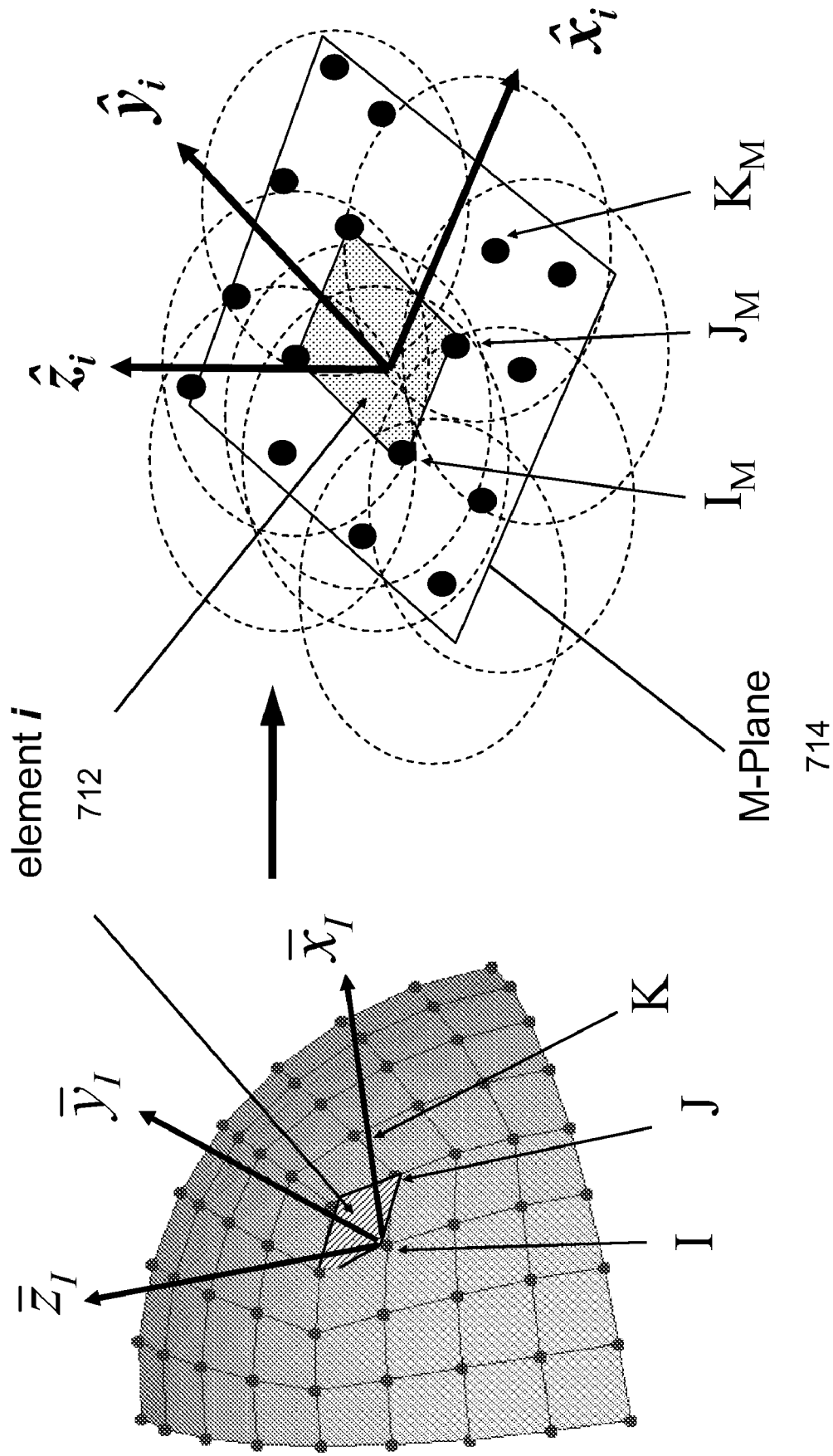
FIG. 7B shows the mapping scheme of an exemplary three-dimensional (3-D) shell structure into a two-dimensional (2-D) space with a local approach based on the present invention.
Figure 7C:
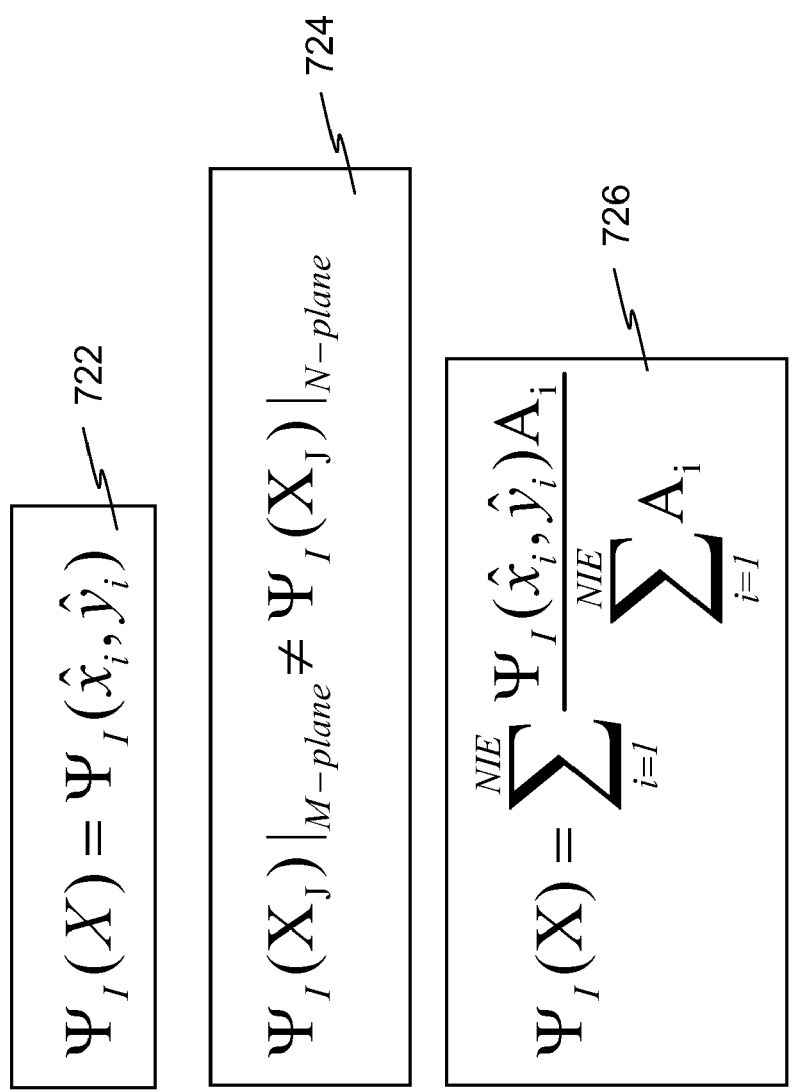
FIG. 7C shows a set of exemplary mesh-free shape functions for a projected 2-D element in accordance with one embodiment of the present invention.

In the local projection procedure, the method maps an element in the 3-D reference surface mesh to a 2-D plane one at a time. Each of the elements in the 3-D reference surface must be mapped to a 2-D plane separately. In one embodiment, an exemplary local projection procedure as shown in FIG. 7B, the element i 712 is mapped to a 2-D M-plane 714. In this embodiment, all of the nodes (e.g., nodes I, J, K, etc.) belonging to surrounding elements of element i 712 are mapped onto the same 2-D M-plane 714 as the corresponding nodes (e.g., nodes $I_M$, $J_M$, $K_M$, etc.). This is to ensure the solution calculations include all nodal domain of influence contributions from these neighboring nodes for each element i 712. There are two sets of coordinate systems shown in FIG. 7B. The coordinate system denoted by $(\bar{x}_I, \bar{y}_I, \bar{z}_I)$ is a coordinate system for element i 712 with its origin located at node I. $\bar{z}_I$ is the initial averaged normal position of the node I. The coordinate system denoted by $(\hat{x}, \hat{y}, \hat{z})$ is a local coordinate system defined for each M-plane 714. The mesh-free shape functions 722 for the element i 712 are then defined with the nodal domain of influence contributions from those projected nodes on the 2-D M-plane 714 as shown in FIG. 7C. It is noted that the shape functions obtained from equation 722 are non-conforming. For example, if another local projection for an element adjacent to element i 712 to another 2-D plane (e.g., N-plane) is performed, the shape functions obtained on the N-plane at the node i are different from that obtained from the M-plane as shown in equation 724. That means when a 3-D shell structure degenerates to a 2-D plate, the constant stress condition can not be recovered. To remedy this problem, an area-weighted smoothing across different projected planes is used for calculating the conforming shape functions as shown in equation 726 in FIG. 7C. In equation 726, NIE is the number of surrounding projected planes that can be evaluated at node X, $A_i$ is the area of the element i, and $(\hat{x}, \hat{y}, \hat{z})$ is the local coordinates of node X in the projected 2-D M-plane for element i. The modified shape functions 726 satisfy the partition of unity property in the general shell problems. This property is important for the shell formulation to preserve the rigid-body translation. It is noted that both the global and local projections possess a one-to-one mapping relationship (i.e., the plurality of projected nodes are mapped from the plurality of nodes in the 3-D space in a one-to-one relationship).

Figure 7D:
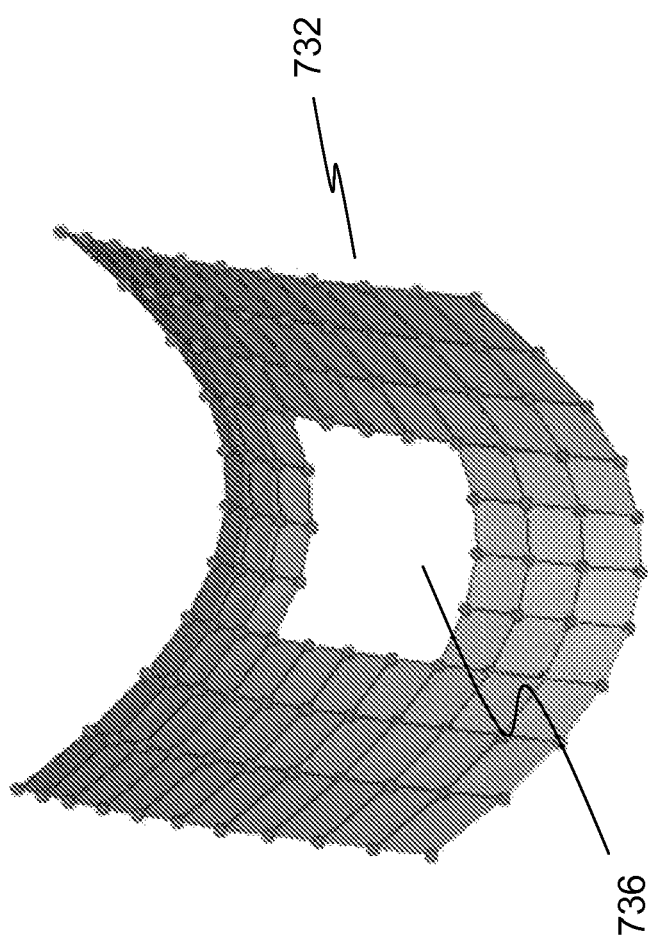
FIGS. 7D-F show three exemplary 3-D shell structures with corresponding projected 2-D mesh-free surface in accordance with one embodiment of the present invention.
Figure 7D:
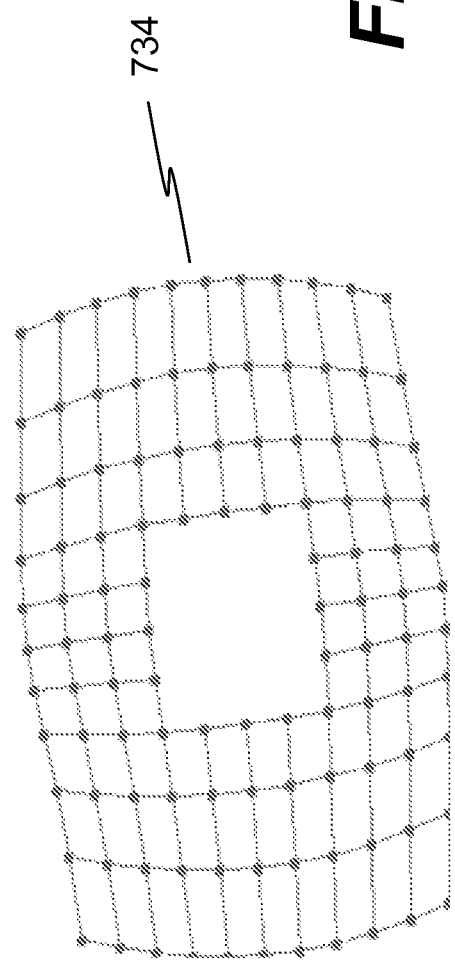
Figure 7E:
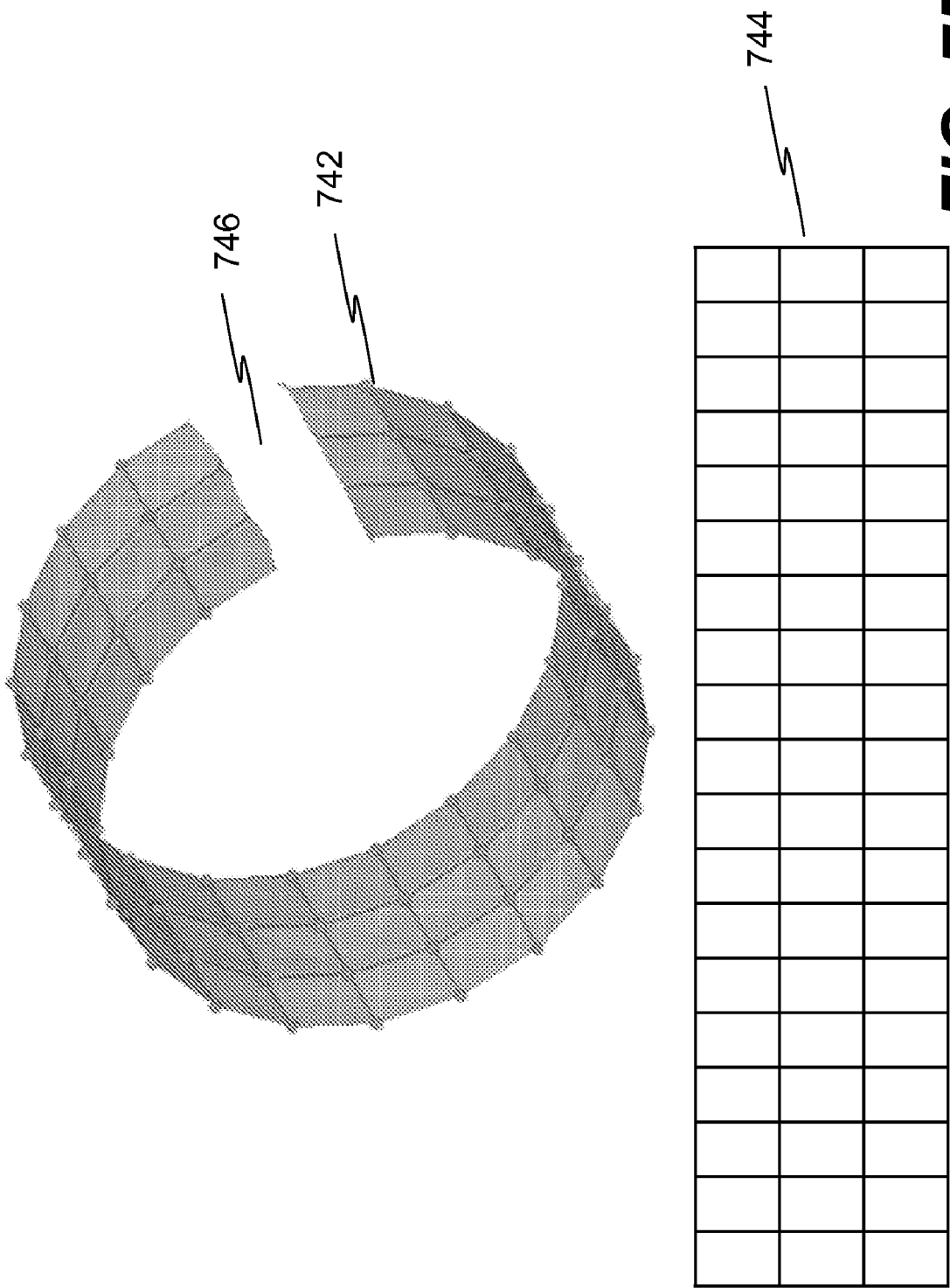
Figure 7F:
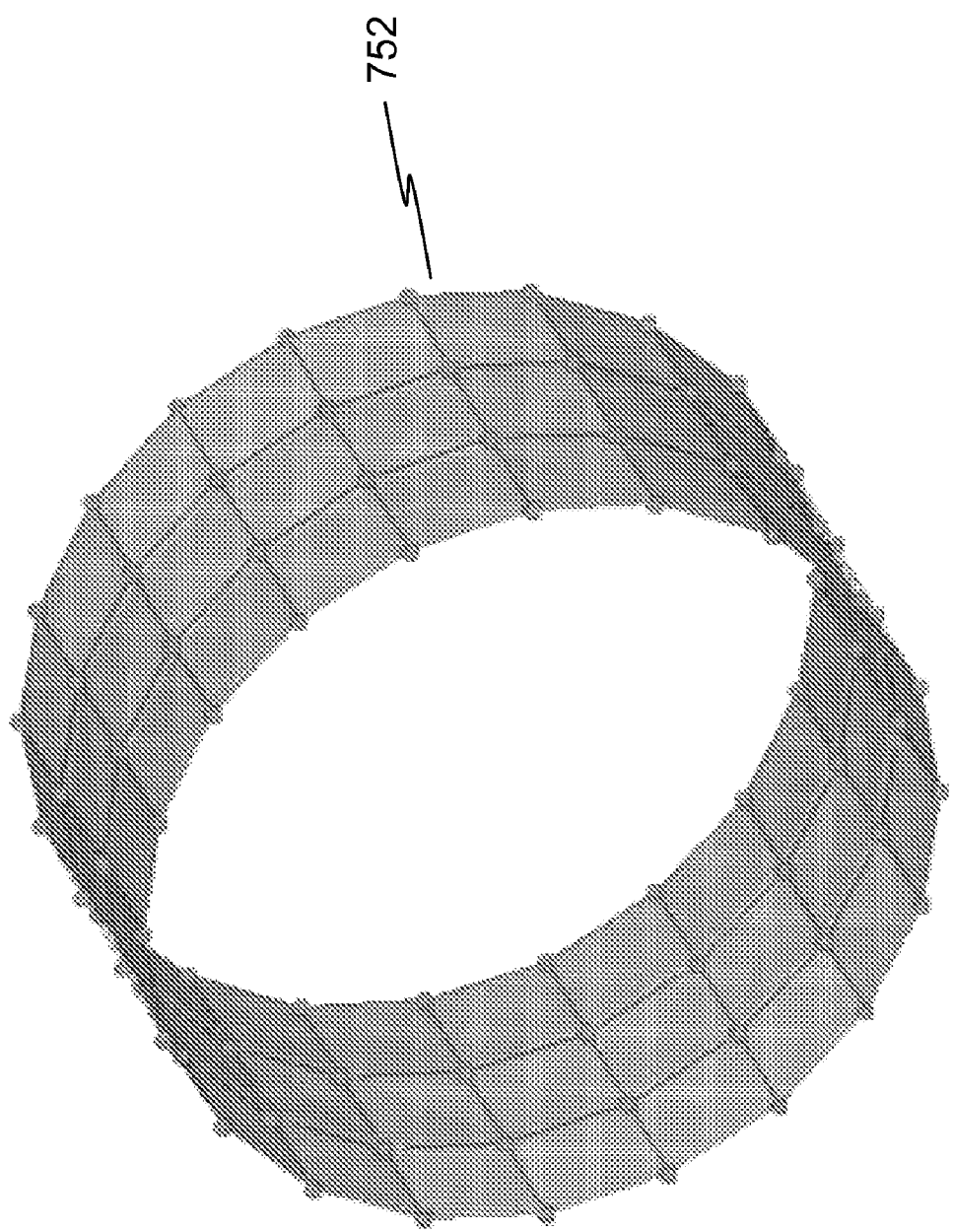

FIGS. 7D-7F show three exemplary 3-D shell structures with corresponding projected 2-D mesh-free planes in accordance with embodiments of the present invention. In one embodiment, FIG. 7D depicts a 3-D curved shell structure 732 with a hole 736 in the middle. Also shown in FIG. 7D is the corresponding projected 2-D mesh-free plane 734. The 2-D mesh-free plane 734 is created using the aforementioned global projection scheme. Similarly, FIG. 7E shows another 3-D shell structure, a cylindrical plate structure 742 with an opening gap 746. Using the global projection scheme, the cylindrical plate structure 742 can be mapped to a 2-D mesh-free plane 744 as shown in FIG. 7E. In additional to the global projection scheme, both of these structures 732 and 742 can be mapped using the local projection scheme described above. Instead of mapping to one 2-D mesh-free plane, each of the background elements in the 3-D structures 732 and 742 is projected to a 2-D M-plane.

Referring now to FIG. 7F, which depicts another 3-D cylindrical plate structure 752 that is similar to the structure 742 shown in FIG. 7D without the gap 746. The enclosed cylindrical structure 752 can only be mapped with the local projection scheme, because the global projection scheme would map one portion onto another portion of the enclosed cylindrical structure 752. Many of the real world general 3-D structures may possess similar characteristics that the exemplary enclosed cylindrical structure 752 exhibits. Hence, the local projection scheme is a vital step to perform mesh-free analysis for an arbitrary 3-D shell structure.

Figure 8A:
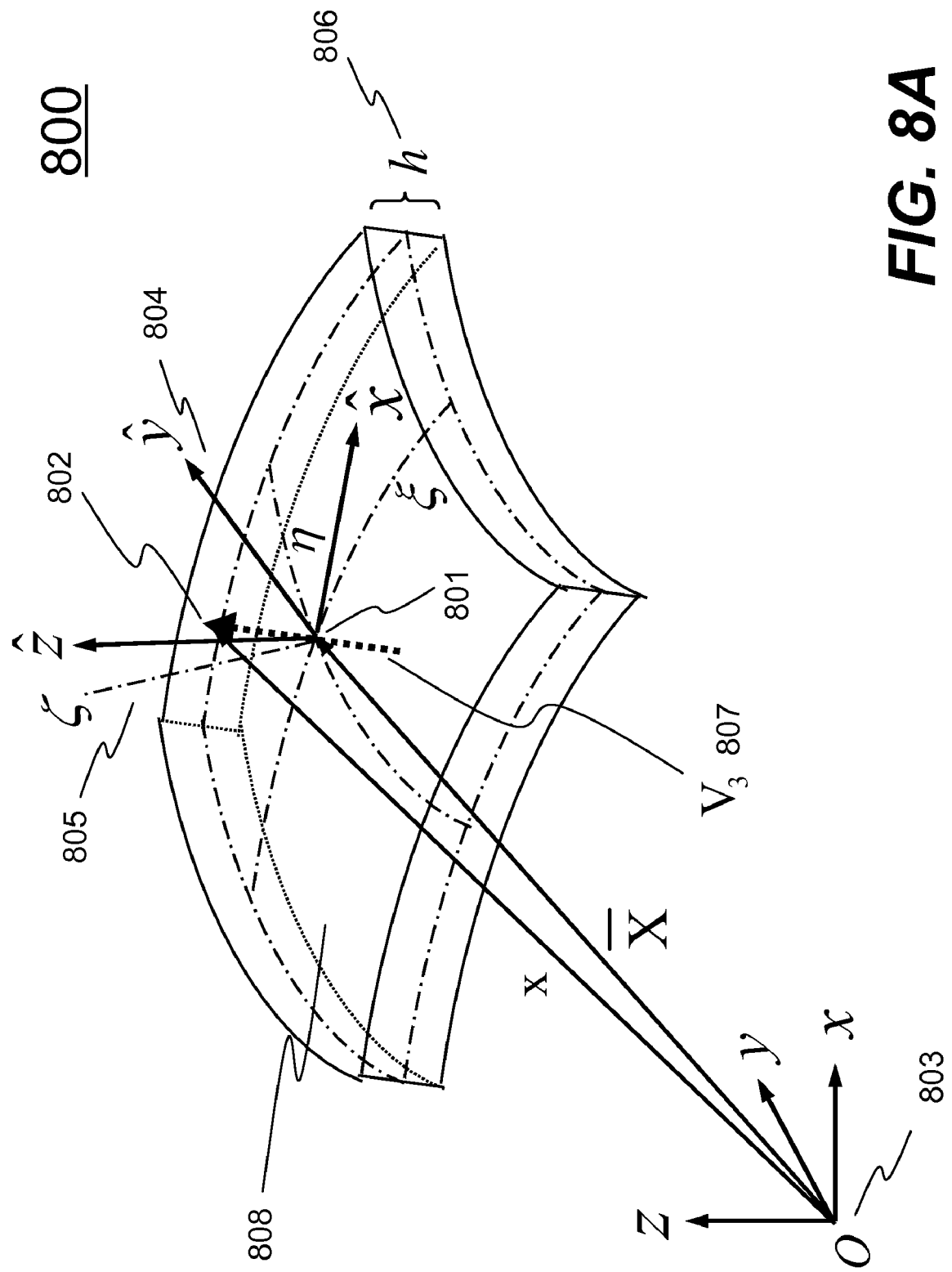
FIG. 8A shows the geometry definitions for an exemplary shell theory according to embodiments of the present invention.

Referring now to FIGS. 8A-J, there is shown an embodiment of the present invention regarding the mathematical theory for the plate or shell employed for the solution of a shell or plate structure using the mesh-free analysis. FIG. 8A depicts an exemplary geometry 800 of a shell with three sets of coordinate systems: global coordinate system 803 (x,y,z), local coordinate system 804 $(\hat{x}, \hat{y}, \hat{z})$, and a parametric coordinate system 805 $(\xi, \eta, \zeta)$. The shell 800 uses the mid-surface 808 as the reference surface. The thickness of the shell or the length of the fiber is denoted by h 806, and the direction of the fiber is denoted by the directional vector $V_3$ 807. In this embodiment, the Mindlin-Reissner plate theory is employed, thus the geometry and kinematical fields of the shell can be described with the reference surface 808 and fiber direction 807. For example, $\bar{x}$ is the global coordinate of the center 801 of the shell on the reference surface 808, while x is the global coordinate of a point 802 on the fiber direction 807.

Figure 8B:
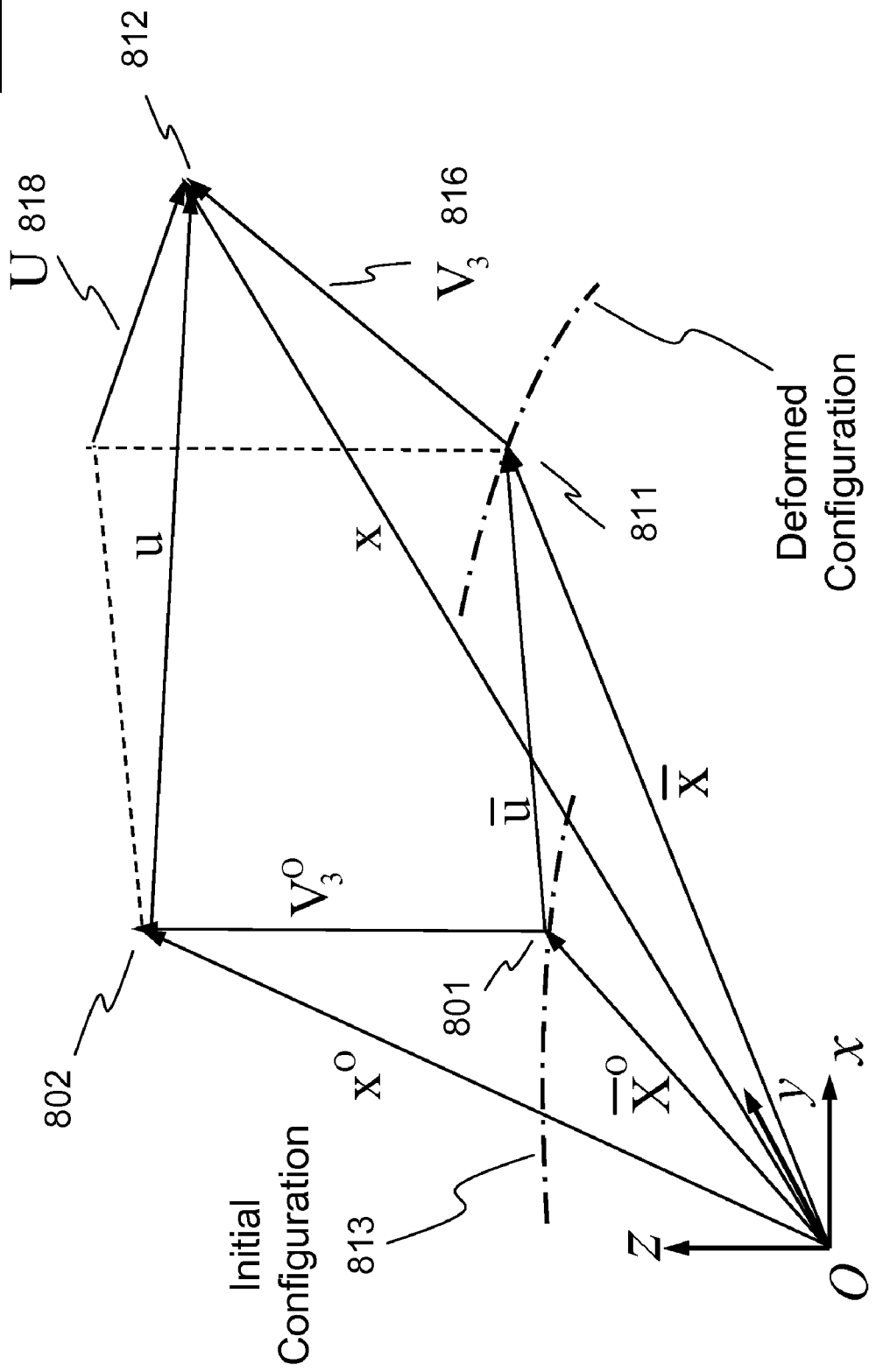
FIG. 8B shows the definitions of global coordinates and displacements for an exemplary shell theory according to embodiments of the present invention.

In conjunction with FIG. 8A, FIG. 8B shows the relationship between global coordinates and displacements of a shell from an initial configuration 813 to a deformed configuration 814. The original center 801 of the shell is deformed to the new position at 811. The deformed location for point 802 is now at 812. In FIG. 8B, the global coordinates $\bar{x}^O$ and $x^O$, and the fiber director $V_3^O$ are denoted with a superscript O in the initial configuration. In the deformed configuration, FIG. 8B shows not only the global coordinates, but also shows the displacements from the initial configuration. For example, the global coordinates of the center 801 of the shell is denoted by $\bar{x}$ at location 811, while x is the deformed global coordinates for the point 802 at location 812. The deformed fiber vector $V_3$ 816 is determined by connecting the locations 811 and 812. In the deformed configuration, there is another quantity called displacements, which is the location of the points measured from its initial configuration. For example, the displacement $\bar{u}$ is the location 811 measured from the original location 801, and the displacement u is the location 812 measured from 802. As a result of the 3-D nature of the deformation, the fiber director $V_3^O$ between original points 801 and 802 may rotate to another orientation $V_3$ 816 defined by the deformed locations 811 and 812. The displacement due to this rotation is denoted by U 818.

Figure 8C:
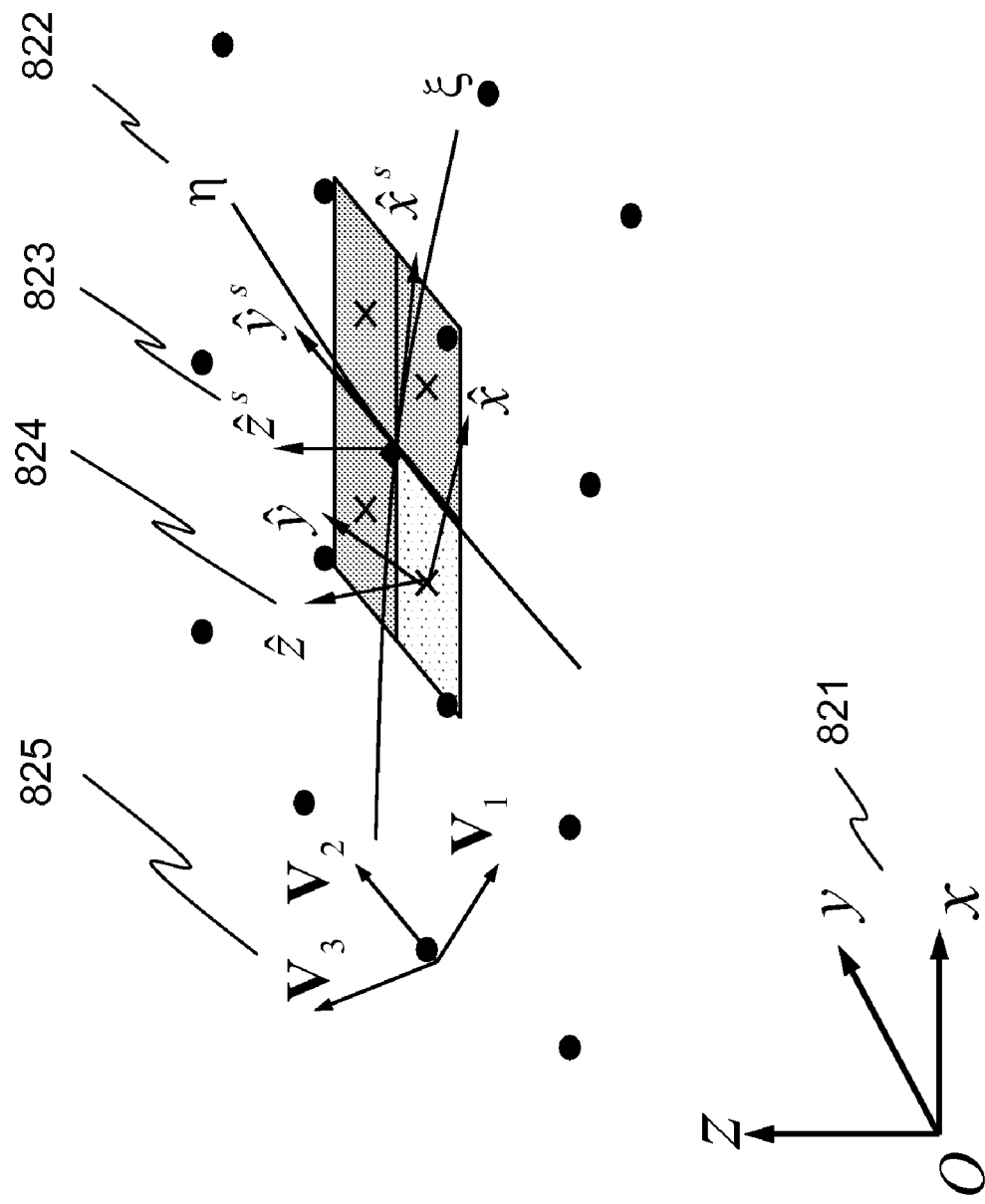
FIG. 8C shows the definitions of five coordinate systems employed for an exemplary shell theory according to embodiments of the present invention.

FIG. 8C shows the coordinate systems 820 used in the plate theory according to one embodiment of the present invention. Depicted in FIG. 8C, there are five coordinate systems: 1) a global coordinate system (x,y,z) 821, 2) a parametric coordinate system $(\xi, \eta, \zeta)$ 822 on the projected M-plane (e.g., 714 in FIG. 7B), 3) a local coordinate system at the center of the projected shell surface $(\hat{x}^s, \hat{y}^s, \hat{z}^s)$ 823, 4) a local co-rotational coordinate system at the center of one of the quadrants of the projected shell $(\hat{x}, \hat{y}, \hat{z})$ 824, and a nodal coordinate system for a fiber of the shell ($V_1, V_2, V_3$) 825.

Figure 8D:
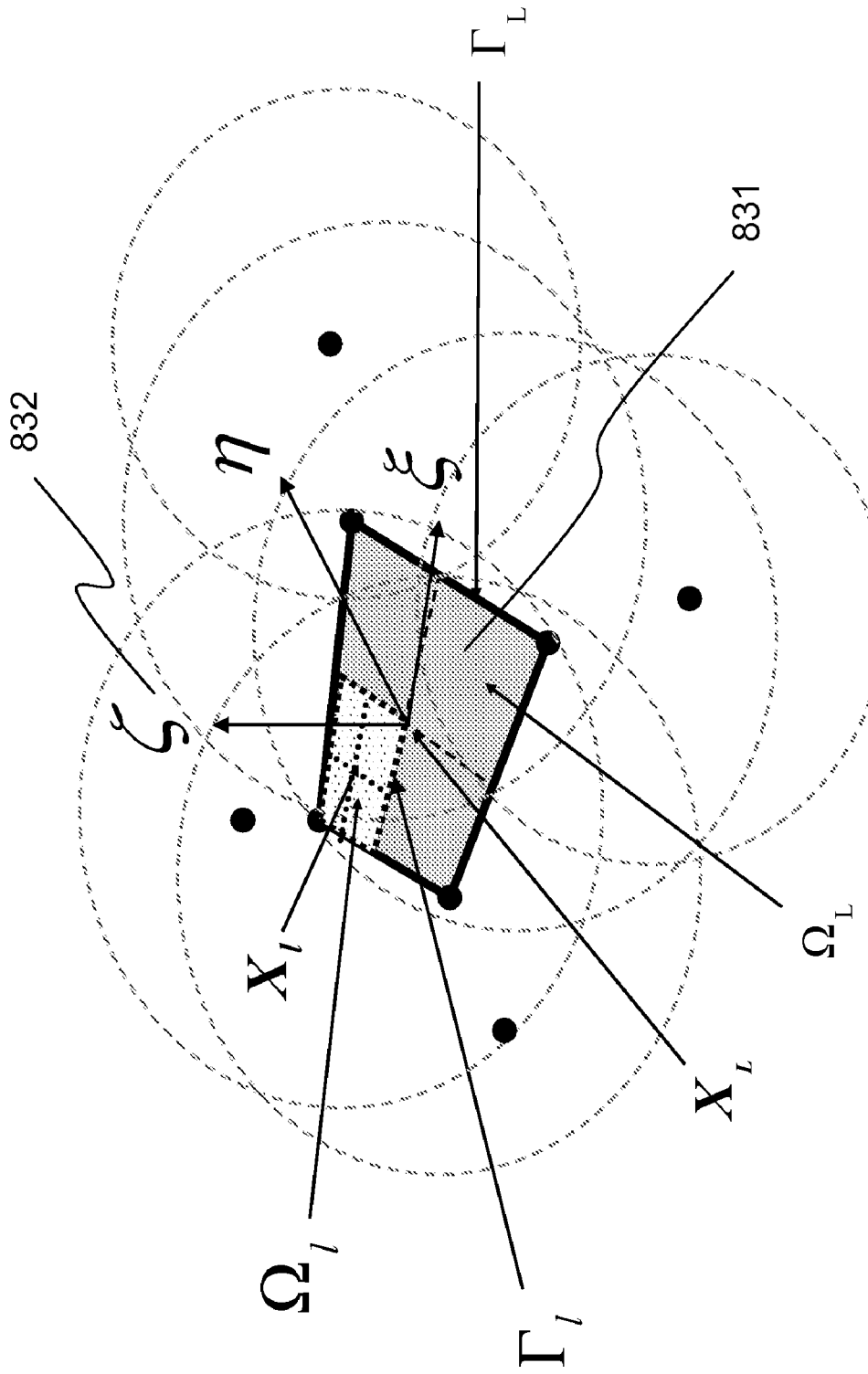
FIG. 8D shows the definitions used in the mesh-free solution integrals employed for an exemplary shell theory according to embodiments of the present invention.

FIG. 8D shows the graphical definitions of the terms used in the integration scheme used in the mesh-free analysis for the 3-D shell structure projected to a 2-D parametric coordinate system according to one embodiment of the present invention. In this embodiment, the projected shell 831 is shown with a parametric coordinate system $(\xi, \eta, \zeta)$ 832 located at the center $X_L$ of the projected shell 831. The area of the projected shell 831 is denoted by $A_L$, the domain $\Omega_L$, and the boundary or border $\Gamma_L$. The projected shell 831 is divided into four quadrants. Each of the quadrants has the following properties: center $X_l$, area $A_l$, domain $\Omega_l$, and boundary $\Gamma_l$. It is noted that the quantities with the subscript uppercase L are for the projected plate and the lowercase l for the quadrants.

Figure 8E:
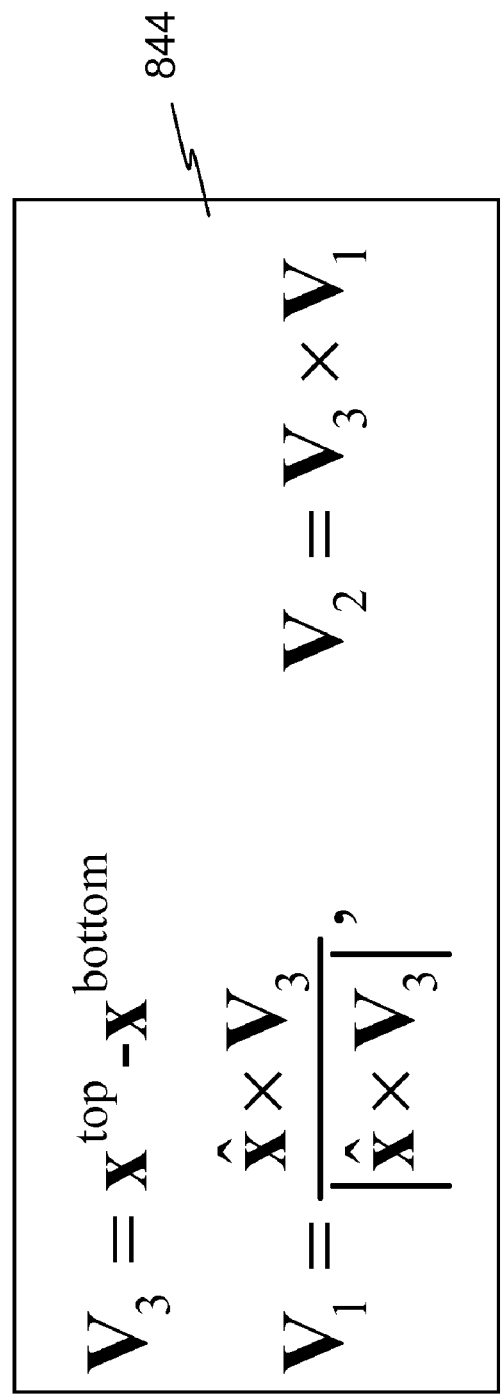

Referring now to FIG. 8E, there is shown a set of equations for the global coordinates and displacements of any point within the body of a shell based on Mindlin-Reissner theory in accordance with one embodiment of the present invention. Equations 842 are for global coordinates x and displacement u, where $\bar{x}$ and $\bar{u}$ are the position vector and displacement of the reference shell surface (i.e., 808 in FIG. 8A), respectively. $V_3$, is the fiber director, U is the displacement resulting from the fiber rotation, and h is the length of the fiber. Equations 844 shows the definitions of the fiber direction vector $V_3$ and two associated base vectors $V_1$ and $V_2$ with respect to the local co-rotational coordinate system $(\hat{x},\hat{y},\hat{z})$.

FIG. 8F shows a set of equations based on the mesh-free approximation in accordance with the present inventions. Equations 852 show the mesh-free approximation of the global coordinates x and displacements u of any given point within the body of the shell, where $x_I$ and $u_I$ are the global coordinates and displacements at node I in a mesh-free model, respectively. $V_{3I}$ is the unit vector of the fiber director and $V_{1I}$, $V_{2I}$ are the base vectors of the nodal coordinate system at node I. $\alpha_I$ and $\beta_I$ are the rotations of the director vector $V_{3I}$ about the $V_{1I}$ and $V_{2I}$ axes. $h_I$ is the fiber length or shell thickness (e.g., 806 of FIG. 8A). The variables with a superscripted bar, $\bar{x}$ and $\bar{u}$ refer to the shell mid-surface (e.g., 808 of FIG. 8A). NP is total number of nodes that affects the evaluated point in the mesh-free approximation calculations. $\Psi_I$ is the 2-D mesh-free shape functions constructed based on either global or local projection mesh-free surface representations, with $(\xi,\eta)$ being either the parametric coordinates or local coordinates of the evaluated point. The local co-rotational coordinate system $(\hat{x},\hat{y},\hat{z})$ (e.g., 824 of FIG. 8C) is defined at each integration point on the shell reference surface (e.g., 808 of FIG. 8A), with $\hat{x}$ and $\hat{y}$ tangent to the reference surface and $\hat{z}$ in the thickness or fiber direction. In order to describe the fiber rotations of a mesh-free node in a shell, a nodal coordinate system for a fiber of the shell ($V_1,V_2,V_3$) (i.e., 825 in FIG. 8C) is introduced. Base vectors $V_1$, $V_2$ and $V_3$ are defined in equations 844 in FIG. 8E. The rotation of the fiber director $V_3$ is then defined from the global rotations $\Delta\theta$ in equations 854 in FIG. 8F.

In the local co-rotational coordinate system, the motions $\hat{x}$ and displacements $\hat{u}$ are approximated by those equations 852 in FIG. 8F. Based on the shell theory, the smoothed Lagrangian strains, $\epsilon^m$, $\epsilon^b$ and $\epsilon^s$, are given in equations 862 in FIG. 8G. The superscripts, m, b and s, are denoted for the membrane, bending and shear terms of the shell theory, respectively. The subscript I is denoted for the evaluated point or node I. Equations 866 show the smoothed strain operators, $B_I^m$, $B_I^b$ and $B_I^s$, are calculated by averaging the consistent strain operators over an area around the evaluated point. It is noted the membrane and bending terms are calculated at each quadrant of the projected plate, while the shear term is calculated at the center of the plate. The subscripts L and l are denoted for the entire plate and a quadrant of the plate, respectively. The definitions of the area and domain are found in FIG. 8D. The term $d_I$ is the vector for the local degrees-of-freedom at each evaluated point—node I. Equation 868 shows the five terms: three translations and two rotations included in vector $d_I$. The consistent strain operators, $\hat{B}_I^m$, $\hat{B}_I^b$ and $\hat{B}_I^s$, are defined in equation 872 in FIG. 8H. The term $J^{-1}$ is the inverse of the Jacobian matrix at the evaluated point.

Finally in this embodiment, the stiffness matrices and internal nodal force vector in the local co-rotational coordinate system $(\hat{x},\hat{y},\hat{z})$ (e.g., 824 of FIG. 8C) are defined in FIG. 8I. The material stiffness matrix $\hat{K}_{IJ}^M$ is defined in equation 874. Equation 875 is the geometric stiffness matrix $\hat{K}_{IJ}^G$ definition and equation 876 defines the internal nodal load vector $f_I^{int}$. There are three terms denoted by the superscripts m, b and s in equations 874 and 876, which correspond to the membrane, bending and shear term from the shell theory, respectively. The detailed coefficient matrices to define the geometric stiffness in equation 875 are listed as equation 878 in FIG. 8J. With the stiffness matrix and the internal nodal force vector, the standard implicit and explicit solution techniques can then apply to obtain the solution of the whole structure.

The integrals in equations 866 in FIG. 8G as well as equations 874, 875 and 876 in FIG. 8I are calculated with local boundary integration scheme. Each background finite element is divided into four integration zones or quadrants $\Omega_l$ as shown in FIG. 8D. Each of the four quadrants has a local co-rotational coordinate system $(\hat{x},\hat{y},\hat{z})$ (e.g., 824 of FIG. 8C) defined at the center (i.e., $X_l$ in FIG. 8D) of the quadrant. In order to avoid a numerical phenomenon called shear locking in the mesh-free analysis of thin shells, the shear term $\hat{K}_{IJ}^s$ of the material stiffness matrix $\hat{K}_{IJ}^M$ in equation 874 of FIG. 8I should be under-integrated by using only one integration zone $\Omega_L$ in each background element as shown in FIG. 8D. Accordingly, a co-rotational coordinate system $(\hat{x}^s,\hat{y}^s,\hat{z}^s)$ (i.e., 823 in FIG. 8C) is defined at the center (i.e., $X_L$ in FIG. 8D) of the background shell element.

Figure 9A:
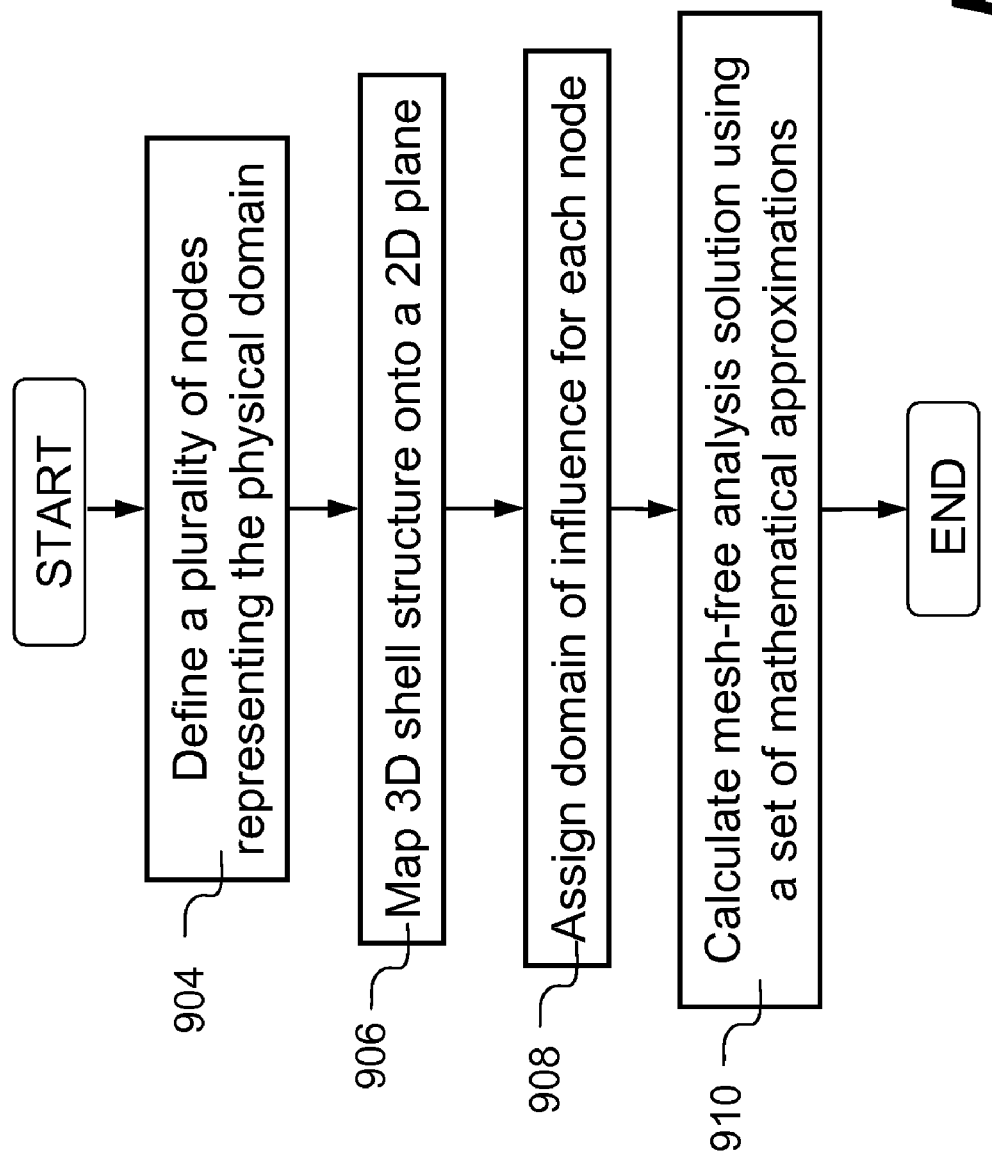
FIG. 9A shows a flowchart or process for the mesh-free analysis of a general 3-D shell or plate structure in accordance with one embodiment of the present invention.

In one embodiment, FIG. 9A shows a flowchart or process 900 of mesh-free analysis of a general 3-D shell structure. The process 900, which is preferably understood in conjunction with the previous figures especially with FIGS. 2, 3, 4A-F, 5A-D, and 7A-B, may be implemented in software, hardware, or a combination of both. The process 900 starts with defining a physical domain (e.g., $\Omega$ 202 in FIG. 2) of the structure to be analyzed at 902. In general, the physical domain is represented by a geometric shape (e.g., square, rectangle, circle, triangle, or any other arbitrary shapes). At 904, a plurality of nodal points is defined to describe the physical domain. These nodal points may be randomly or regularly distributed in the physical domain. A set of nodes representing the boundary of the physical domain are located on the boundary (e.g., $\Gamma$ 203 in FIG. 2). The rest of the nodes are located in the interior of the physical domain. One of the techniques to define these nodes in the physical domain is to use the readily available FEA model, which contains all nodal definitions of a 3-D structure. The FEA model may be generated from a pre-processor of an application, a computer aided design software, a FEA mesh generation software, and the like. The FEA model may also be created a mesh-generation module embedded inside mesh-free analysis computer program product.

After the plurality of nodes is defined, the process 900 moves to 906. A background mesh of the 3-D shell structure is established. In one embodiment, the FEA mesh is used as the background mesh. The 3-D structure defined by the background mesh is then projected to a 2-D plane (e.g., FIGS. 7A and 7B). The detailed processes of these projections or mappings will be described in FIG. 9B. At 906, after the 3-D structure is projected to a 2-D plane, a domain of influence or support (e.g., 208 in FIG. 2 or 308 in FIG. 3) is then defined for each of the plurality of the projected nodes (e.g., FIG. 7B). Finally at 910, the solution of the mesh-free analysis can be obtained with a set of mathematical approximations (e.g., FIGS. 4A-4F and 5A-D). In one embodiment, the mesh-free approximation is based on moving least-squares method.

Figure 9B:
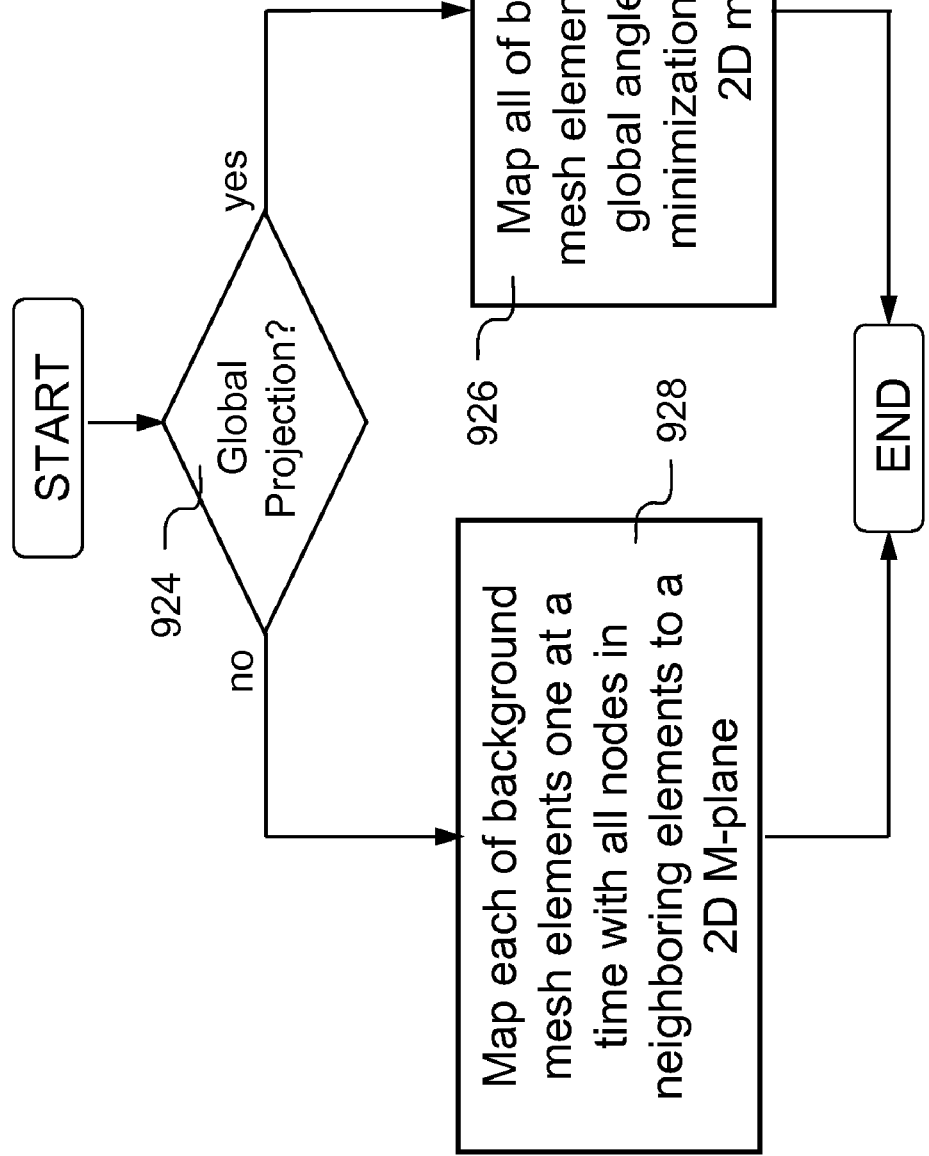
FIG. 9B shows a flowchart or process for the projection or mapping of a general 3-D shell structure to a 2-D plane in accordance with embodiments of the present invention.

FIG. 9B shows a process 920 or flowchart of projecting the 3-D shell structure onto a 2-D plane in accordance with embodiments of the present invention. The process 920, which is preferably understood in conjunction with the previous figures especially with FIGS. 7A and 7B, may be implemented in software, hardware, or a combination of both. The process 920 starts with a choice of using a global or local projection technique at 924. If the global projected is selected, the process moves to 926 (i.e., FIG. 7A). At 926, all of the background 3-D shell elements are projected to a 2-D plane defined by a parametric coordinate system ($\xi, \eta$) globally. The projection is based on a minimization of relative distortion of angle scheme, which ensures the unique position of one interior node and the length and direction of one edge connected to that node.

Back to 924, if the local projection technique is selected, the process 920 moves to 928 (e.g., FIG. 7B). At 928, each of the elements in the background mesh is projected to the 2-D plane one at a time. Each element is projected to a 2-D space called M-plane. All the neighboring nodes in the elements that surround the projected element are projected to the M-plane, so the contribution of these nodes to the evaluated node is accounted. The local projection is a general case for the global projection. In order to accommodate an arbitrary 3-D structure, the local projection technique is required. After one of these projection methods is selected and performed, the process 920 ends. The mesh-free analysis can be carried on.

FIG. 9C shows a flowchart or process 940 of obtaining the mesh-free analysis solution using a set of mathematical approximation after the mesh-free model is established in accordance with one embodiment of the present invention. The process 940, which is preferably understood in conjunction with the previous figures especially with FIGS. 4A-F, 5A-D and 8A-J, may be implemented in software, hardware, or a combination of both. The process 940 starts by choosing a type of mathematical approximation at 942. One embodiment of the approximation is called moving least-squares approximation (e.g., FIGS. 4A-C). As a result of the choice in 942, the mesh-free shape functions (e.g. FIGS. 4D-F) are defined and employed in the mesh-free analysis at 944. The process 940 moves to 946 to apply modifications that are necessary to accommodate the essential boundary conditions (e.g., FIGS. 5A-D). Finally at 948, the process 940 calculates the stiffness matrix, internal nodal force vector by integrating each of the projected 2-D shell elements. The integration is performed basing on the equations and formulas documented in FIGS. 8A-J.

Although an exemplary embodiment of invention has been disclosed, it will be apparent to those skilled in the art that various changes and modifications may be made to achieve the advantage of the invention. It will be obvious to those skilled in the art that some components may be substituted with another component providing same function. The appended claims cover the present invention.

What is claimed is:

1. A method for mesh-free analysis of a general three-dimensional shell structure, the method comprising:
   defining the general shell structure as a physical domain represented by a plurality of nodes in a three-dimensional space in a computer system;
   creating a plurality of projected nodes by mapping the plurality of nodes in the three-dimensional space onto a two-dimensional plane in the computer system;
   assigning a plurality of domain of influences, one for each of the plurality of projected nodes in the computer system; and
   calculating a solution of the physical domain using a set of approximations, in the computer system; includes creating a set of mesh-free shape functions for each of the plurality of projected nodes, applying essential boundary condition modifications to the set of mesh-free shape functions and evaluating a set of integrals at said each of the plurality of projected nodes.

2. The method of claim 1, said defining the general structure as the physical domain further comprising:
   extracting the plurality of nodes from a finite element analysis model.

3. The method of claim 2, wherein the finite element analysis model is generated by a pre-processor of a finite element software package.

4. The method of claim 2, wherein the finite element model is retrieved in form of data packs over a network.

5. The method of claim 1, wherein the plurality of projected nodes is mapped from the plurality of nodes in three-dimensional space in a one-to-one relationship.

6. The method of claim 5, wherein the plurality of projected nodes includes a set of interior nodes representing interior of the physical domain and a set of boundary nodes representing boundary of the physical domain.

7. The method of claim 1, said creating the plurality of projected nodes further comprising:
   establishing a parametric plane representing a reference surface describing the general shell structure based on a projection scheme.

8. The method of claim 7, wherein the reference surface is mid-surface of the general shell structure.

9. The method of claim 7, wherein the projection scheme is a global projection, by which the parametric plane is determined based on minimization of angle distortion globally in the three-dimensional space.

10. The method of claim 7, wherein the projection scheme is a local projection procedure, by which all of the plurality of nodes are projected to the two-dimensional plane one at the time.

11. The method of claim 10, further comprising:
    creating a set of mesh-free shape functions for each of the plurality of projected nodes.

12. The method of claim 11, wherein the set of shape functions is defined by area-averaging all local projections for said each of the plurality of nodes.

13. The method of claim 1, wherein the plurality of domain of influences overlaps one another.

14. The method of claim 1, wherein each of the plurality of domain of influences has different shapes.

15. The method of claim 14, wherein one of the shapes is circular.

16. The method of claim 14, wherein one of the shapes is quadrilateral.

17. The method of claim 1, wherein the shape of the domain of influence varies at each solution cycle in a time-domain analysis.

18. The method of claim 1, wherein the essential boundary condition modifications are based on a transformation scheme to enforce the essential boundary conditions.

19. The method of claim 1, wherein the set of integrals is of internal nodal forces for explicit analysis and of stiffness matrices for implicit analysis.

20. The method of claim 19, wherein the stiffness matrices include material stiffness matrix and geometric stiffness matrix.

21. The method of claim 19, wherein the set of integrals includes terms contributed from membrane, bending and shear of a shell theory.

22. The method of claim 21, wherein the integrals are evaluated by a local boundary integration scheme.

23. The method of claim 22, wherein the local boundary integration scheme integrates a projected area for shear term based on the shell theory and divides the projected area into four quadrants, each of the quadrants is integrated separately for membrane and bending terms.

24. The method of claim 1, said evaluating a set of integrals further comprising:
summing up contributions from a subset of the plurality of projected nodes, each of the subset having the domain of influence overlaps the evaluated node.

25. A computer memory having a computer readable medium stored thereon to perform a method for mesh-free analysis of a general three-dimensional shell structure, the computer readable medium comprising:
computer readable code for defining the general shell structure as a physical domain represented by a plurality of nodes in a three-dimensional space;
computer readable code for creating a plurality of projected nodes by mapping the plurality of nodes in the three-dimensional space onto a two-dimensional plane;
computer readable code for assigning a plurality of domain of influences, one for each of the plurality of projected nodes; and
computer readable code for calculating a solution of the physical domain using a set of approximations, which includes creating a set of mesh-free shape functions for each of the plurality of projected nodes, applying essential boundary condition modifications to the set of mesh-free shape functions and evaluating a set of integrals at said each of the plurality of projected nodes.

26. The computer readable medium of claim 25, said computer readable code for defining the general structure as the physical domain further comprising:
computer readable code for extracting the plurality of nodes from a finite element analysis model.

27. The computer readable medium of claim 26, wherein the finite element analysis model is generated by a pre-processor of a finite element software package.

28. The computer readable medium of claim 26, wherein the finite element model is retrieved in form of data packs over a network.

29. The computer readable medium of claim 25, wherein the plurality of projected nodes is mapped from the plurality of nodes in three-dimensional space in a one-to-one relationship.

30. The computer readable medium of claim 29, wherein the plurality of projected nodes includes a set of interior nodes representing interior of the physical domain and a set of boundary nodes representing boundary of the physical domain.

31. The computer readable medium of claim 25, said computer readable code for creating the plurality of projected nodes further comprising:
computer readable code for establishing a parametric plane representing a reference surface describing the general shell structure based on a projection scheme.

32. The computer readable medium of claim 31, wherein the reference surface is mid-surface of the general shell structure.

33. The computer readable medium of claim 31, wherein the projection scheme is a global projection, by which the parametric plane is determined based on minimization of angle distortion globally in the three-dimensional space.

34. The computer readable medium of claim 31, wherein the projection scheme is a local projection procedure, by which all of the plurality of nodes are projected to the two-dimensional plane one at the time.

35. The computer readable medium of claim 34, further comprising:
computer readable code for creating a set of mesh-free shape functions for each of the plurality of projected nodes.

36. The computer readable medium of claim 35, wherein the set of shape functions is defined by area-averaging all local projections for said each of the plurality of nodes.

37. The computer readable medium of claim 25, wherein the essential boundary condition modifications are based on a transformation scheme to enforce the essential boundary conditions.

38. The computer readable medium of claim 25, said computer readable code for evaluating a set of integrals further comprising:
computer readable code for summing up contributions from a subset of the plurality of projected nodes, each of the subset having the domain of influence overlaps the evaluated node.

39. A computer system for facilitating mesh-free analysis of a general three-dimensional shell structure, the system comprising:
a main memory storing computer readable code for an application module;
at least one processor coupled to the main memory, said at least one processor executing the computer readable code in the main memory to cause the application module to perform operations of:
defining the general shell structure as a physical domain represented by a plurality of nodes in a three-dimensional space;
creating a plurality of projected nodes by mapping the plurality of nodes in the three-dimensional space onto a two-dimensional plane;
assigning a plurality of domain of influences, one for each of the plurality of projected nodes; and
calculating a solution of the physical domain using a set of approximations, which includes creating a set of mesh-free shape functions for each of the plurality of projected nodes, applying essential boundary condition modifications to the set of mesh-free shape functions and evaluating a set of integrals at said each of the plurality of projected nodes.

40. The system of claim 39, said defining the general structure as the physical domain further comprising:
extracting the plurality of nodes from a finite element analysis model.

41. The system of claim 39, said creating the plurality of projected nodes further comprising:
establishing a parametric plane representing a reference surface describing the general shell structure based on a projection scheme.

42. The system of claim 41, wherein the projection scheme is a global projection, by which the parametric plane is determined based on minimization of angle distortion globally in the three-dimensional space.

43. The system of claim 41, wherein the projection scheme is a local projection procedure, by which all of the plurality of nodes are projected to the two-dimensional plane one at the time.

44. The system of claim 39, said evaluating a set of integrals further comprising:
summing up contributions from a subset of the plurality of projected nodes, each of the subset having the domain of influence overlaps the evaluated node.

* * * * *